(12) United States Patent
Koide et al.

(10) Patent No.: US 8,274,157 B2
(45) Date of Patent: **\*Sep. 25, 2012**

(54) SEMICONDUCTOR DEVICE AND A METHOD OF MANUFACTURING THE SAME

(75) Inventors: Yuki Koide, Tokyo (JP); Masataka Minami, Tokyo (JP)

(73) Assignee: Renesas Electronics Corporation, Kawasaki-shi (JP)

( \* ) Notice: Subject to any disclaimer, the term of this patent is extended or adjusted under 35 U.S.C. 154(b) by 91 days.

This patent is subject to a terminal disclaimer.

(21) Appl. No.: 12/883,278

(22) Filed: Sep. 16, 2010

(65) Prior Publication Data

US 2011/0001236 A1    Jan. 6, 2011

Related U.S. Application Data

(63) Continuation of application No. 12/352,591, filed on Jan. 12, 2009, now Pat. No. 7,812,456.

(30) Foreign Application Priority Data

Feb. 14, 2008    (JP) ................................. 2008-033012

(51) Int. Cl.
*H01L 23/48*    (2006.01)
(52) U.S. Cl. ................ 257/776; 257/E23.145

(58) Field of Classification Search ............ 257/758, 257/759, 774, 776, E23.145
See application file for complete search history.

(56) References Cited

U.S. PATENT DOCUMENTS 6,277,669 B1    8/2001  Kung et al.
7,812,456 B2 \*  10/2010 Koide et al. ............. 257/776

FOREIGN PATENT DOCUMENTS

JP    09-306914 A    11/1997
JP    2003-17530 A    1/2003

OTHER PUBLICATIONS

Office Action issued Oct. 25, 2011 in Japanese Patent Application No. 2008-033012.

\* cited by examiner

*Primary Examiner* — Quoc Hoang
(74) *Attorney, Agent, or Firm* — Miles & Stockbridge P.C.

(57) ABSTRACT

A semiconductor device having redistribution interconnects in the WPP technology and improved reliability, wherein the redistribution interconnects have first patterns and second patterns which are electrically separated from each other within the plane of the semiconductor substrate, the first patterns electrically coupled to the multi-layer interconnects and the floating second patterns are coexistent within the plane of the semiconductor substrate, and the occupation ratio of the total of the first patterns and the second patterns within the plane of the semiconductor substrate, that is, the occupation ratio of the redistribution interconnects is 35 to 60%.

9 Claims, 21 Drawing Sheets

FIG. 21
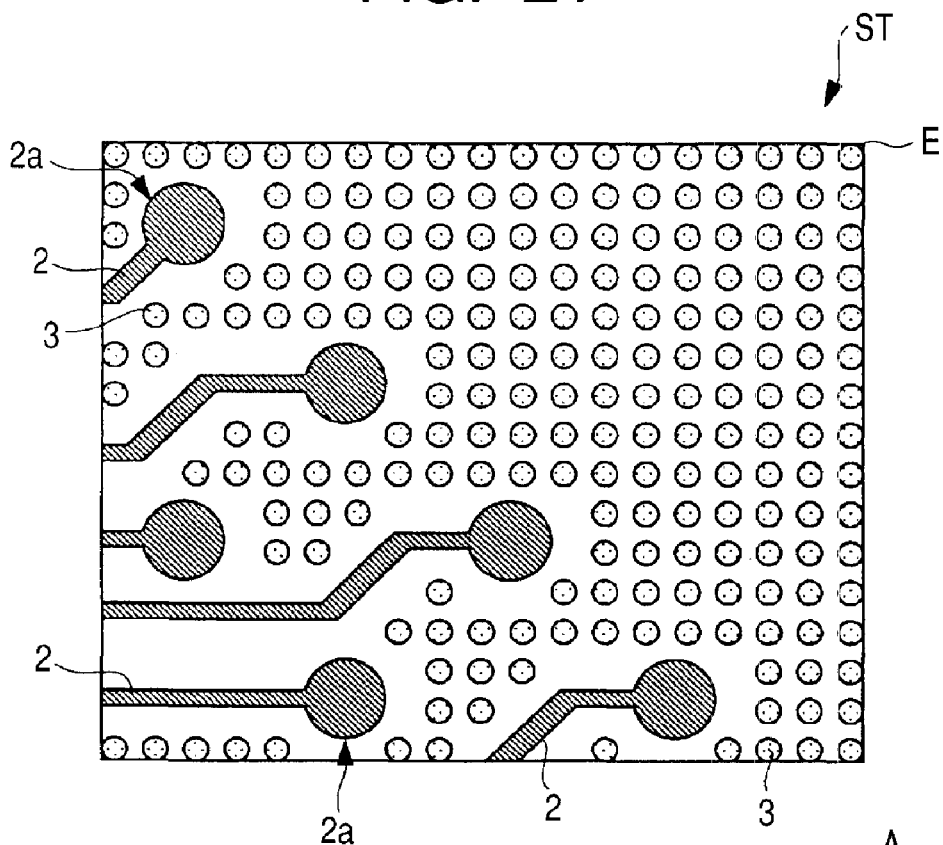
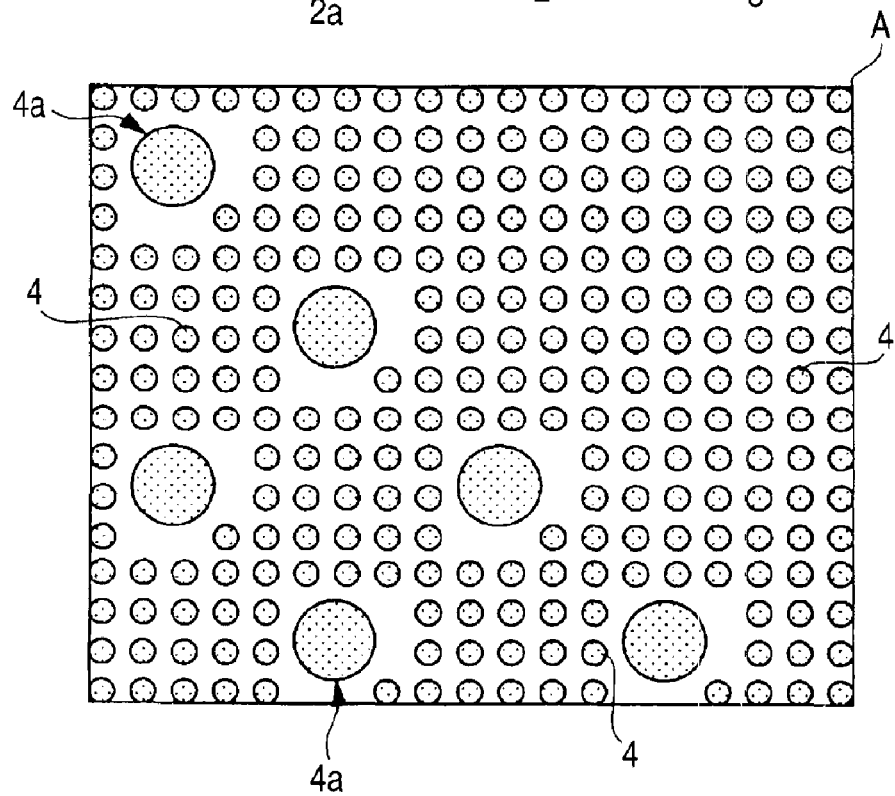

SEMICONDUCTOR DEVICE AND A METHOD OF MANUFACTURING THE SAME

CROSS-REFERENCE TO RELATED APPLICATIONS

This application is a continuation of application Ser. No. 12/352,591 filed Jan. 12, 2009 now U.S. Pat. No. 7,812,456. Also, the disclosure of Japanese Patent Application No. 2008-33012 filed on Feb. 14, 2008 including the specification, drawings and abstract is incorporated herein by reference in its entirety.

BACKGROUND OF THE INVENTION

The present invention relates to a semiconductor device and a method of manufacturing the same, in particular, to an effective technology applied to a semiconductor device having redistribution interconnects in a WPP (Wafer Process Package) technology.

The WPP technology (or WLP (Wafer Level Package) technology) is a technology of integrating a wafer process (pre-process) and a package process (post-process) and finishing packaging while in the wafer process. This WPP technology is advantageous because it needs far fewer steps than a technology in which the package process is performed for each of semiconductor chips cut out from a semiconductor wafer. In the package process of the WPP technology, redistribution interconnects electrically coupled to semiconductor elements formed in the pre-process are formed by the plating process and covered with a surface protective film.

Japanese Unexamined Patent Publication No. 9 (1997)-306914 (patent document 1) discloses a technology for forming dummy plating patterns over a semiconductor wafer together with real patterns which become the actual interconnects as a method of forming interconnects for semiconductor elements. This patent document 1 is aimed to form uniform plating interconnects stably as interconnects for semiconductor elements and does not teach the stable formation of redistribution interconnects in the WPP technology.

[Patent document 1]
Japanese Unexamined Patent Publication No. 9 (1997)-306914

SUMMARY OF THE INVENTION

In high-speed SRAM (Static Random Access Memory) and CMOS (complementary Metal Oxide Semiconductor) logic products, for example, the above-described WPP technology is employed for the purpose of a reduction in package cost and speedup and they have a package structure so as to permit flip chip coupling to a package substrate via bump electrodes made of solder.

When WPP is adopted, a semiconductor device is manufactured by the following steps. First, semiconductor elements such as MISFET (Metal Insulator Semiconductor Field Effect Transistor) are formed over the main surface of a semiconductor wafer, followed by the formation of a plurality of multi-layer interconnects over the semiconductor elements. Then, a silicon nitride film and a silicon oxide film are formed over the multi-layer interconnects and further a polyimide resin film is formed over the silicon oxide film. The steps up till now are the wafer process of the WPP technology and the subsequent steps are the package process of the WPP technology.

Subsequently, the silicon oxide film, the silicon nitride film and the polyimide resin film are patterned to form an opening portion having a bottom surface from which the uppermost-level interconnect is exposed. A thin electrode layer (barrier layer/seed layer) is formed over the polyimide resin film including the inside of the opening portion, and redistribution interconnects are formed over the electrode layer by using the plating process. The redistribution interconnects are each made of, for example, a film stack of a copper film and a nickel film. After the formation of a polyimide resin film over the redistribution interconnects, patterning is carried out to expose end portions of the redistribution interconnects. Bump electrodes are then formed over the exposed end portions of the redistribution interconnects. In such a manner, packaging is performed in the form of a semiconductor wafer, thereby making it possible to manufacture a semiconductor device having redistribution interconnects and bump electrodes coupled to the redistribution interconnects.

The inventors of the present invention have found that the semiconductor device using this WPP technology have problems that appearance abnormalities (large grain diameter and surface roughness) occur in the redistribution interconnects formed by using the plating process and that there is a difference in film thickness between the center portion and the peripheral portion of the semiconductor wafer. Particularly, in the center portion of the semiconductor wafer, the film thickness of each redistribution interconnect is small and appearance abnormalities are marked. The bump electrode formed over one end portion of the redistribution interconnect having appearance abnormalities reduces the reliability of the semiconductor device by peeling. Therefore, the production yield of the semiconductor device is reduced by judging the appearance abnormalities of the redistribution interconnects as failures.

According to studies conducted by the inventors of the present invention, the appearance abnormalities of the redistribution interconnects have dependence upon redistribution interconnect patterns and concentrate at the end portions of the redistribution interconnects near the boundary between a region A where the redistribution interconnects electrically coupled to semiconductor elements are formed and a region B where the redistribution interconnects are not formed. That is, it is considered that an electric field is apt to concentrate at the end portions of the redistribution interconnects near the boundary from the viewpoint of the plating process, thereby causing the local growth of the current density to increase the crystal grain size of the redistribution interconnects. Therefore, to cope with the appearance abnormalities of the redistribution interconnects, it is conceivable that the redistribution interconnects should also be formed in the region B where the redistribution interconnects are not formed. However, the appearance abnormalities may occur at the end portions of the redistribution interconnects due to a difference in the density of the redistribution interconnects only when the redistribution interconnects are formed in the region B. Then, even in the local region such as the above region A, it is necessary to prevent a large difference in the density of the redistribution interconnects.

The cause of producing the difference in the thickness of the redistribution interconnect between the center portion and the peripheral portion of the semiconductor wafer is considered to be that a plating current for obtaining an appropriate film thickness cannot be secured because the plating current value at the time of forming the redistribution interconnects depends upon the occupation ratio of the redistribution interconnects within the plane of the semiconductor wafer. Therefore, the difference in the thickness of the plating film (film thickness of the redistribution interconnect) must be reduced by the occupation ratio of the redistribution interconnects in the in-plane region of the semiconductor wafer.

It is an object of the present invention to provide a technology for improving the reliability of a semiconductor device.

The above and other objects and new feature of the present invention will become apparent from the description of this text and the accompanying drawings.

A brief description is subsequently given of a typical one of the inventions disclosed in this application.

According to an embodiment of the present invention, redistribution interconnects in the WPP technology have real patterns (first patterns) and dummy patterns (second patterns) which are electrically separated from each other within the plane of a semiconductor substrate. The real patterns electrically coupled to a plurality of multi-layer interconnects and floating dummy patterns are formed within the plane of the semiconductor substrate.

A brief description is given of an effect obtained by a typical one of the inventions disclosed in this application.

According to an embodiment, since the difference in the density of the redistribution interconnects formed within the plane of the semiconductor substrate can be reduced, the reliability of the semiconductor device can be improved.

BRIEF DESCRIPTION OF THE DRAWINGS

FIG. 21 is a plan view of a semiconductor device according to another embodiment of the present invention.

DETAILED DESCRIPTION OF THE EMBODIMENTS

Figure 1:
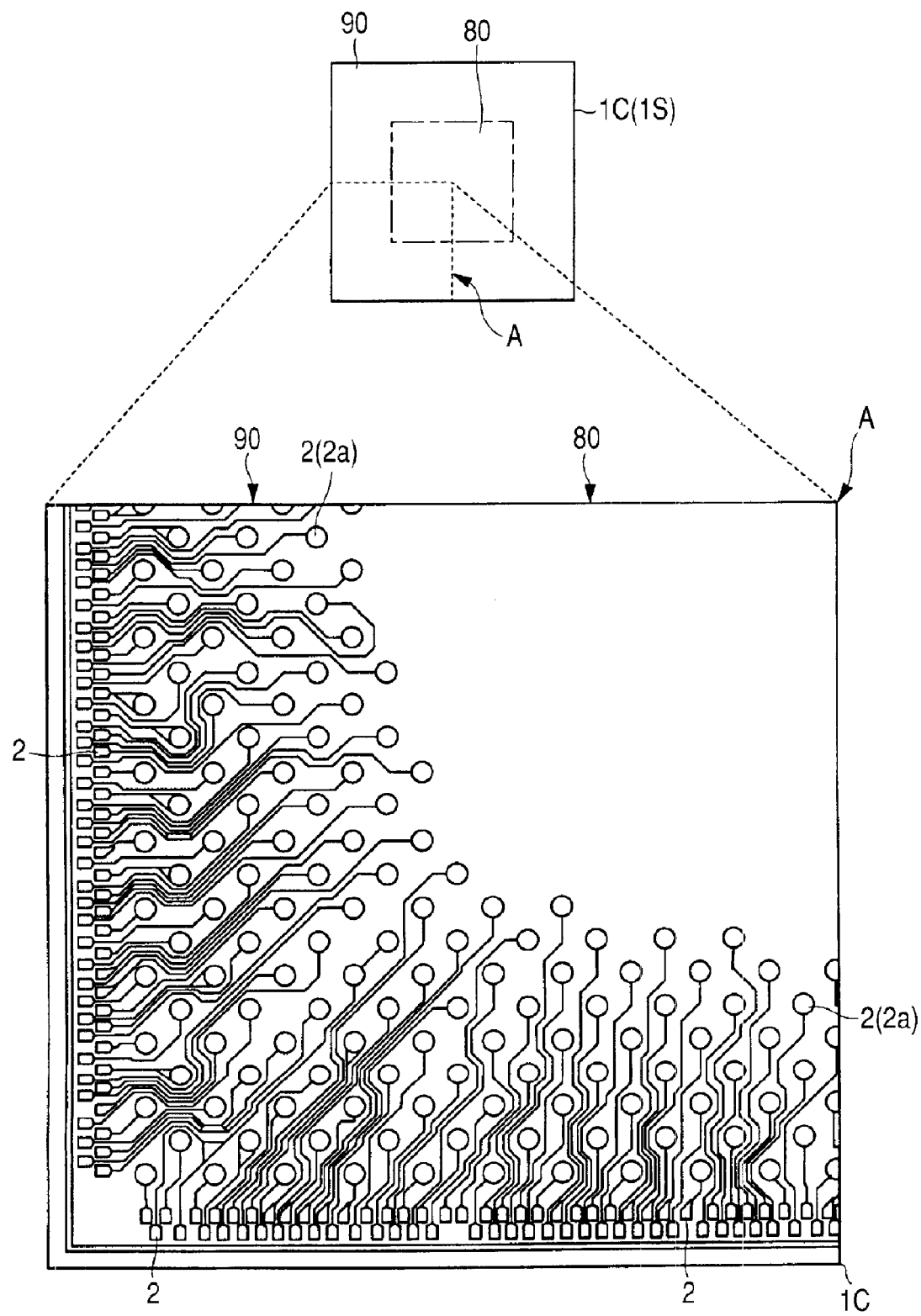
FIG. 1 is a plan view of a semiconductor device according to an embodiment of the present invention.

Embodiments of the present invention will be described in detail hereinunder with reference to the accompanying drawings. In all the drawings for explaining the embodiments, members having the same functions are given the same reference symbols and their repeated descriptions may be omitted. In the drawings for explaining the following embodiments, even when they are plan views for making the configuration of the present invention comprehensive, they may be hatched.

Embodiment 1

The semiconductor wafer of this embodiment is a semiconductor device having a CSP (Chip Size Package) structure and the WPP technology is used to manufacture the same. CSP is a generic term for packages which are the same or larger in size than a semiconductor chip. Since they can be reduced in size and weight and the length of an internal interconnect can be reduced, a signal delay and noise can be suppressed. The characteristic structure of the semiconductor device according to this embodiment will be described with reference to FIGS. 1 to 3.

Figure 2:
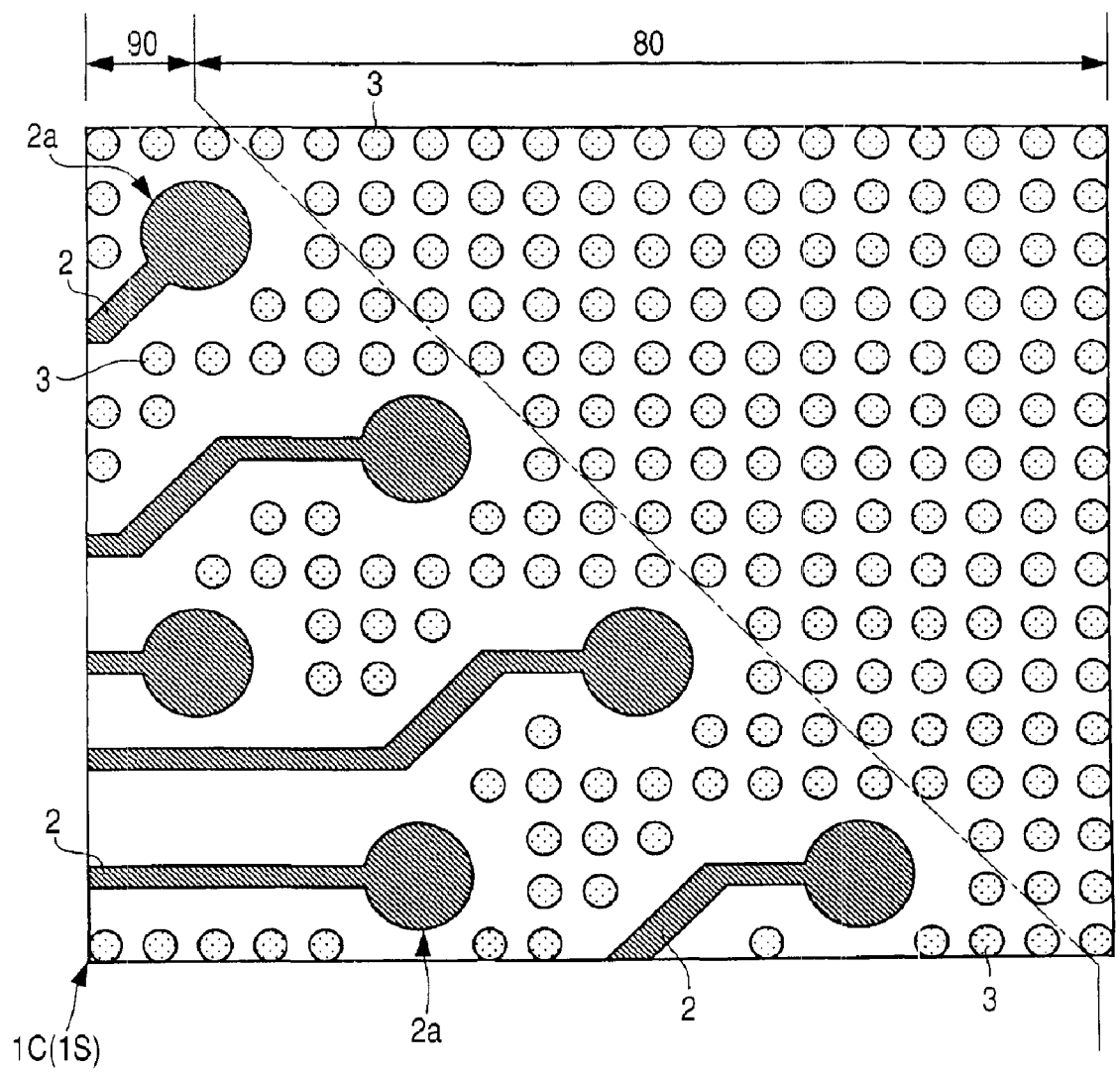
FIG. 2 is an enlarged plan view of the semiconductor device shown in FIG. 1.
Figure 3:
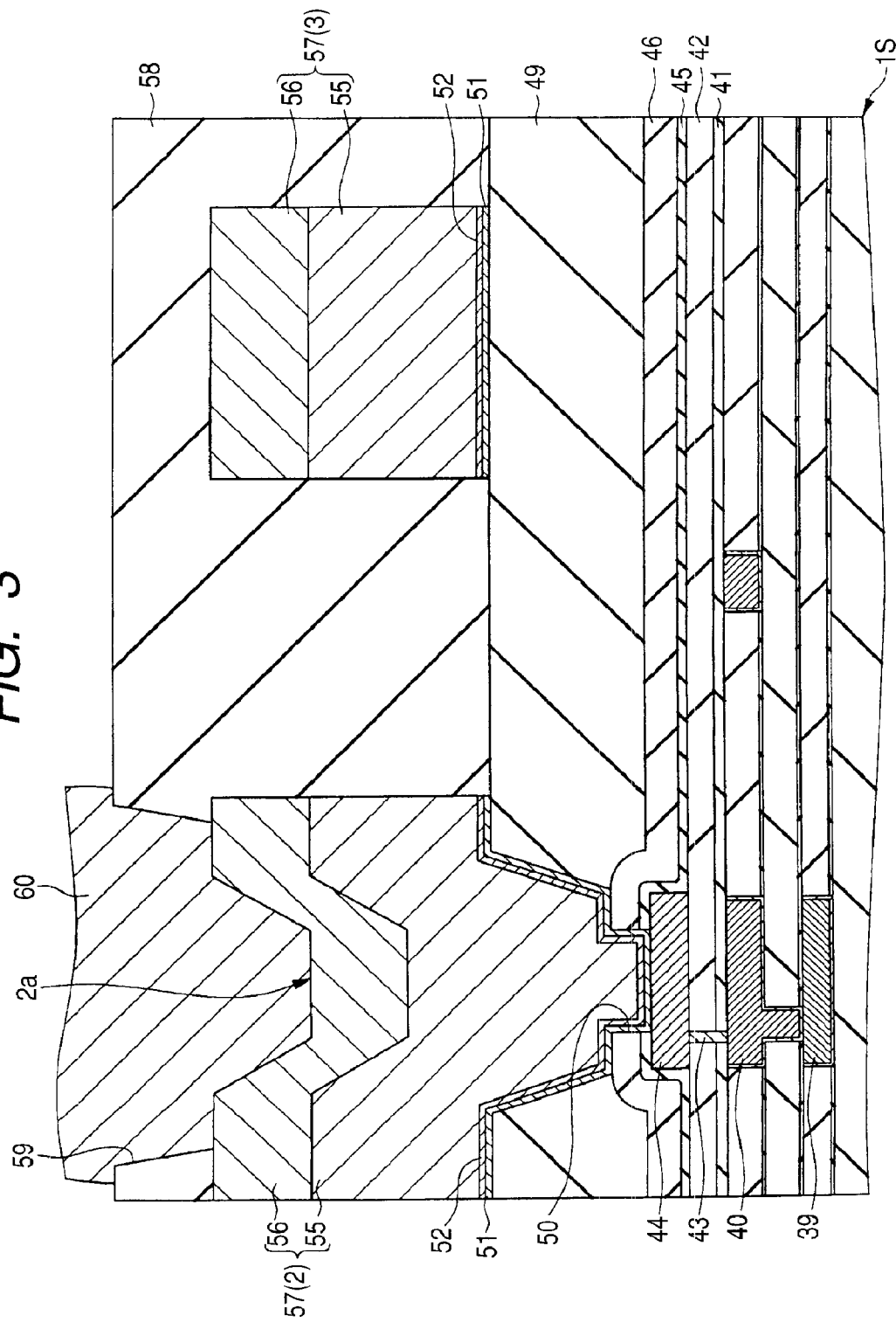
FIG. 3 is a sectional view of the key section of the semiconductor device shown in FIG. 1.

FIG. 1 is a plan view of a semiconductor chip 1C in this embodiment and an enlarged part (region A surrounded by the broken line) thereof. FIG. 2 is a more enlarged plan view of the semiconductor chip 1C shown in FIG. 1. Real patterns 2 and dummy patterns 3 shown in FIG. 2 are redistribution interconnects in the WPP technology. To make explanation easy, the dummy patterns 3 are not shown in FIG. 1. The real patterns 2 are electrically coupled to internal circuits including the semiconductor elements of the semiconductor chip 1C, and the dummy patterns 3 are electrically separated, that is, floated. FIG. 3 is a sectional view of the key part of the semiconductor chip 1C.

As shown in FIG. 1, the rectangular semiconductor chip 1C has a central region 80 (region surrounded by the one-dot broken line) and a peripheral region 90 around the central region 80 within the plane. The surface of the semiconductor chip 1C is covered with a surface protective film which is, for example, a polyimide resin film, and bump electrodes (not shown) for communicating a signal between the outside and the inside of the semiconductor chip 1C are formed in opening portions formed in the surface protective film. The bump electrodes are formed over the land electrodes 2a of the real patterns 2 in the enlarged region A of the semiconductor chip 1C in FIG. 1. Even in the semiconductor chip 1C which is a small-sized semiconductor device having a CSP structure, regions (the area of the land electrode 2a) in which the bump electrode is formed can be secured by leading the real patterns 2 (redistribution interconnects) toward the central region 80 from the periphery of the semiconductor chip 1C. The real patterns 2 are formed in the peripheral region 90.

As shown in FIG. 2, within the plane of the semiconductor chip 1C, the real patterns 2 and the dummy patterns 3 are coexistent. They are formed at the same time as redistribution interconnects in the WPP technology and electrically separated from each other (see FIG. 3). As described above, the real patterns 2 are formed in the peripheral region 90 and the dummy patterns 3 are formed in the central region 80 and the peripheral region 90 located between real patterns 2. By forming the dummy patterns 3 in the central region 80 and the peripheral region 90, the redistribution interconnects are distributed almost uniformly within the plane of the semiconductor chip 1C and the difference in the density of the redistribution interconnects can be reduced more than when there are no dummy patterns 3.

The circular land electrode 2a located at one end of each of the real patterns 2 has a diameter of, for example, 108 μm and a pitch of, for example, 180 μm. The circular dummy pattern 3 has a diameter of, for example, 34 μm and a pitch of, for example, 50 μm. The planar shape of the dummy pattern 3 may be polygonal with all the corner portions having a blunt angle to ease stress.

The processing size of the dummy pattern 3 is smaller than the processing size of the real pattern 2. Thereby, the dummy pattern 3 can be formed between real patterns 2 in the peripheral region 90, and the redistribution interconnects can be distributed almost uniformly within the plane of the semiconductor chip 1C. The size of the dummy pattern 3 is larger than the minimum line width of the redistribution interconnect and such that it is not lost in the step of removing a barrier layer and a seed layer after the formation of the redistribution interconnects.

As shown in FIG. 3, multi-layer interconnects including a third-layer interconnect 39, a fourth-layer interconnect 40 and a fifth-layer interconnect 44 are formed over a semiconductor substrate 1S configuring the semiconductor chip 1C. The multi-layer interconnects serve to form a circuit by electrically coupling a plurality of semiconductor elements formed below the multi-layer interconnects. A thin silicon oxide film 45 and a thin silicon nitride film 46 are formed as passivation films over the semiconductor substrate 1S to cover the multi-layer interconnects. The silicon oxide film 45 and the silicon nitride film 46 are both inorganic insulating films and can be formed by plasma CVD.

A polyimide resin film 49 which is an organic insulating film is formed over the silicon nitride film 46. Redistribution interconnects 57 which are each made of a film stack of a copper film 55 and a nickel film 56 formed by the plating process are formed over the polyimide resin film 49. The redistribution interconnects 57 configure the real patterns 2 and the dummy patterns 3 as shown in FIG. 1 and FIG. 2. A polyimide resin film 58 which is an organic insulating film is formed over the polyimide resin film 49 as a surface protective film (insulating film) to cover the redistribution interconnects 57.

The reason why the surface protective film is an organic insulating film made of a polyimide resin or the like is that the handling of the semiconductor chip is made easy by forming a relatively soft organic insulating film as the uppermost layer because the insulating film is apt to be cracked at the time of handling (carrying) the semiconductor chip and it is difficult to handle it when the uppermost insulating film is an inorganic insulating film.

An opening portion 59 is formed in the polyimide resin film 58 partially overlying the redistribution interconnect 57 of the real pattern 2, and part of the redistribution interconnect 57 of the real pattern 2 is exposed to configure the land electrode 2a. This land electrode 2a serves as an external electrode for the semiconductor chip 1C. Further, a bump electrode 60 is formed over the land electrode 2a in such a manner that it is electrically coupled to the land electrode 2a to communicate a signal with the outside and carry out coupling with the outside by mounting. A signal can be communicated with the outside by coupling a wire bonding to the top of the land electrode 2a without forming the bump electrode 60.

The redistribution interconnects 57 are formed to complete the packaging of a semiconductor wafer and have the function of coupling the fifth-layer interconnect 44 which is the uppermost-level interconnect of the multi-layer interconnects to the bump electrode 60. That is, the redistribution interconnects 57 serve as a leading interconnect for coupling the fifth-layer interconnect 44 to the bump electrode 60. In other words, it can be said that the redistribution interconnects 57 serve as an interposer for changing the spacing of the fifth-layer interconnects 44 to the spacing of the bump electrodes 60.

The redistribution interconnect 57 of the real pattern 2 overlies part of the fifth-layer interconnect 44 which is the uppermost-level interconnect of the multi-layer interconnects and is electrically coupled to the multi-layer interconnects including the fifth-layer interconnect 44 in the opening portion 50 formed in the silicon oxide film 45, the silicon nitride film 46 and the polyimide resin film 49 to communicate a signal with the outside.

Meanwhile, the redistribution interconnect 57 of the dummy pattern 3 is covered with the polyimide resin film 49 and the polyimide resin film 58 which are organic insulating films, electrically separated from the multi-layer interconnects and the real pattern 2 and floating. Therefore, the dummy pattern 3 does not communicate a signal with the outside. However, the difference in the density of the redistribution interconnects formed by the plating process is reduced by forming the dummy patterns 3, thereby making it possible to prevent the occurrence of appearance abnormalities in the real patterns 2. Further, since abnormalities failure such as the peeling of the bump electrode 60 formed over the real pattern 2 free from appearance abnormalities can be prevented, the reliability of the semiconductor device can be improved.

Figure 4:
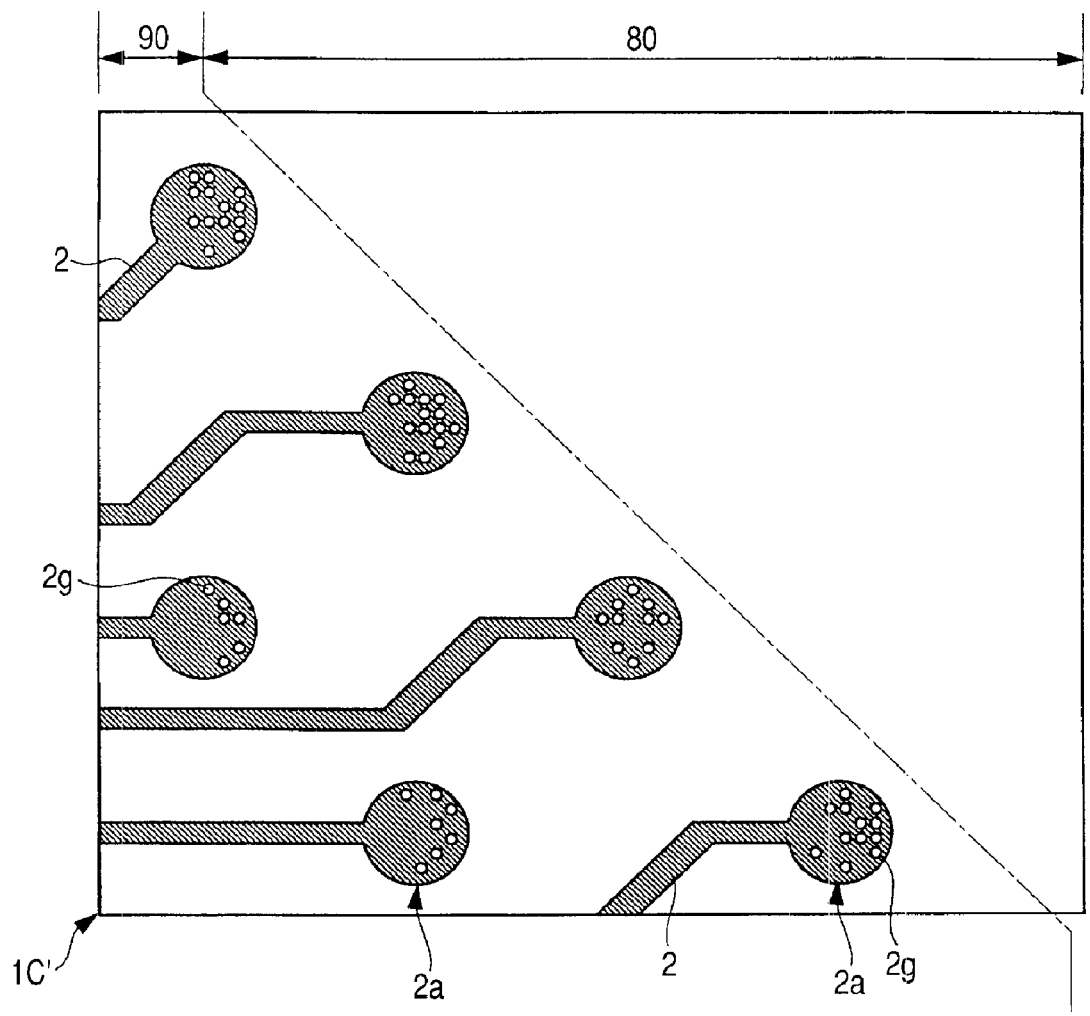
FIG. 4 is an enlarged plan view of a semiconductor device studied by the inventors of the present invention corresponding to FIG. 2.

A description is given of a case where the dummy patterns 3 are not formed with reference to FIG. 4. FIG. 4 is an enlarged plan view of a semiconductor chip 1C' corresponding to the semiconductor chip shown in FIG. 2 and studied by the inventors of the present invention. The other configuration is the same as that of the semiconductor chip 1C shown in FIGS. 1 to 3.

As shown in FIG. 4, 2 g of copper (copper film 55) or nickel (nickel film 56) grains formed by the plating process becomes large at the end portions (land electrodes 2a) of the real patterns 2 in the peripheral region 90 where the real patterns 2 are formed and near the boundary between the central region 80 and the peripheral region 90 when the dummy patterns are not formed in the central region 80 where the real patterns 2 are not formed to roughen the surface, thereby causing appearance abnormalities. Further, it is understood that appearance abnormalities occur in the real patterns 2 between the real patterns 2 on the inner side of the peripheral region 90. The appearance abnormalities can be confirmed by a microscope.

However, in this embodiment, the occurrence of appearance abnormalities in the real patterns 2 can be prevented as shown in FIG. 2 by the coexistence of the dummy patterns 3 and the real patterns 2. Stated more specifically, the occurrence of appearance abnormalities in the real patterns 2 can be prevented by forming the redistribution interconnects 57 as the dummy patterns 3 in the central region 80 excluding the peripheral region 90 where the real patterns 2 of the redistribution interconnects 57 are formed. Further, the occurrence of appearance abnormalities in the real patterns 2 can be prevented more by forming the redistribution interconnects 57 of the dummy patterns 3 between the real patterns 2 in the peripheral region 90 where the real patterns 2 of the redistribution interconnects 57 are formed. This is considered to be because the difference in the density of the redistribution interconnects 57 comprised of the real patterns 2 and the dummy patterns 3 formed by the plating process in local regions such as the regions between the real patterns 2.

In this embodiment, the redistribution interconnects 57 in the package process of the WPP technology are formed over the polyimide resin film 49 which is an organic insulating film and the polyimide resin film 58 which is an organic insulating film is formed as a surface protective film to cover the redistribution interconnects 57. Although the dummy patterns 3 are thereby floated (electrically separated), adhesion between the polyimide resin film 49 and the polyimide resin film 58 can be ensured because the same type of organic simulating films are used.

The expansion and contraction of the redistribution interconnects 57 and the polyimide resin films 49 and 58 surrounding the redistribution interconnects 57 occur in a reliability test in which temperature cycling between a low-temperature and high-temperature is repeated. However, the generated stress can be eased by processing the dummy patterns 3 to a smaller size than the processing size of the real patterns 2.

Figure 5:
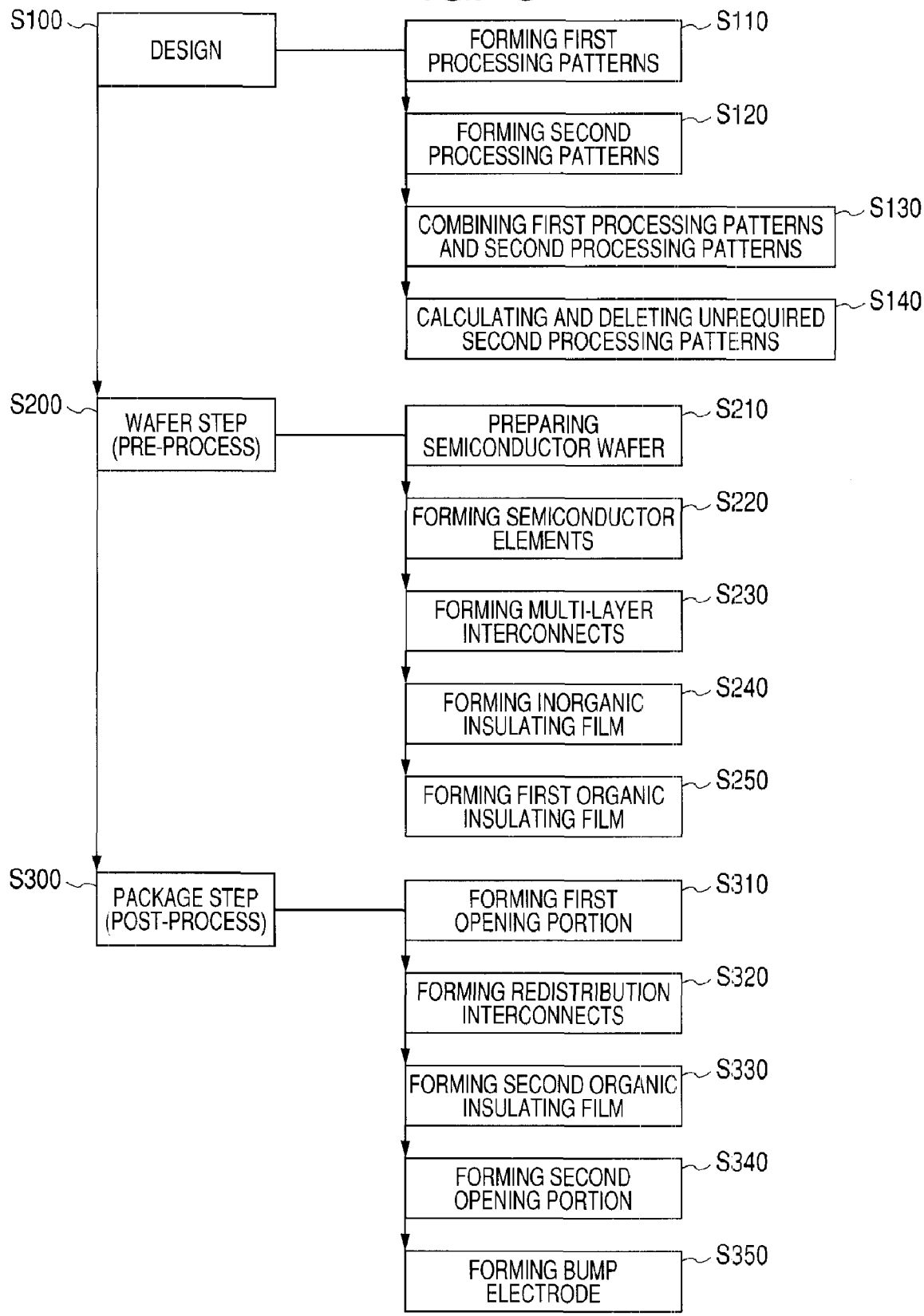
FIG. 5 is a flow chart of the manufacturing process of the semiconductor device according to the above embodiment of the present invention.

A description is subsequently given of a method of manufacturing the semiconductor device in this embodiment with reference to FIGS. 5 to 20. FIG. 5 is a flow chart of the manufacturing process of the semiconductor device in this embodiment, FIGS. 6 to 10 show processing patterns in the design step, and FIGS. 11 to 18 are a plan view and sectional views of the semiconductor device in the wafer step and the package step.

As shown in FIG. 5, briefing the manufacturing process of the semiconductor device in this embodiment, the layout of semiconductor elements and circuit wirings are first designed in the design step (S100). Then, in the wafer step (S200), so-called "pre-process" in the manufacture of the semiconductor device is carried out to form semiconductor elements. Then, in the package step (S300), so-called "post-process" in the manufacture of the semiconductor device is carried out to form redistribution interconnects as lead lines and package them. In the WPP technology, this wafer step and the package step are carried out on a semiconductor wafer.

A description is specifically given of the pattern design of the redistribution interconnects 57 in the design step (S100). The design of the other configuration may be carried out by a known method using a computer in consideration of DFM (design for manufacturing).

Figure 6:
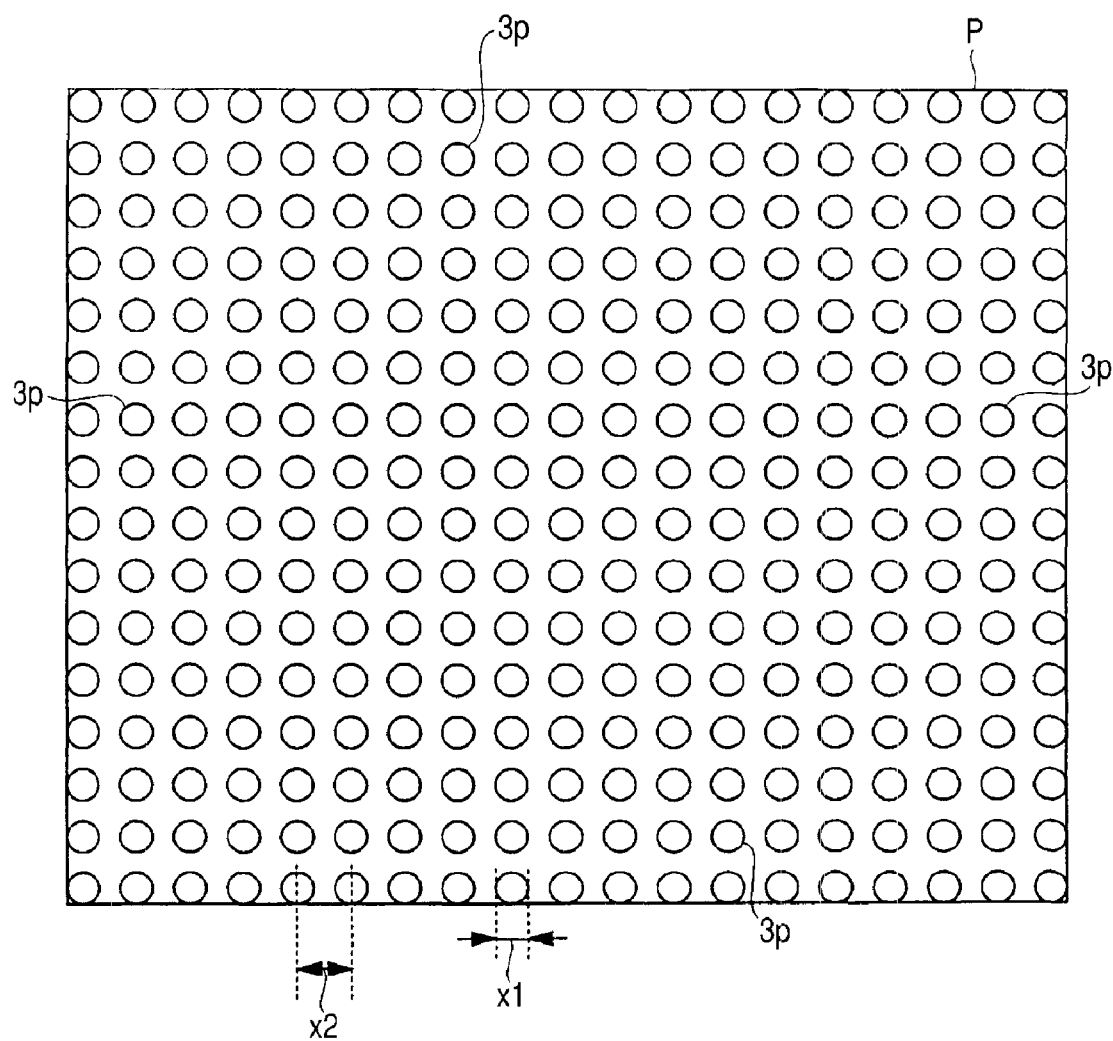
FIG. 6 is a diagram showing processing patterns in the design step of FIG. 5.

As shown in FIG. 6, dummy processing patterns 3p having a predetermined diameter x1 and a predetermined pitch x2 are formed in a predetermined region P of a semiconductor wafer (semiconductor chip) by using a computer (S110). The dummy processing patterns 3p have a 64 angled planar shape, a diameter x1 of 34 µm and a pitch x2 of 50 µm and uniformly arranged in the region P. Unrequired dummy processing patterns 3p are removed until the final design stage. The dummy patterns 3 of the above-described redistribution interconnects 57 are designed to be larger than the minimum line width and the minimum spacing of the redistribution interconnects 57 and smaller than the land electrodes 2a of the real patterns 2 of the redistribution interconnects by the remaining dummy processing patterns 3p which are not removed.

Figure 7:
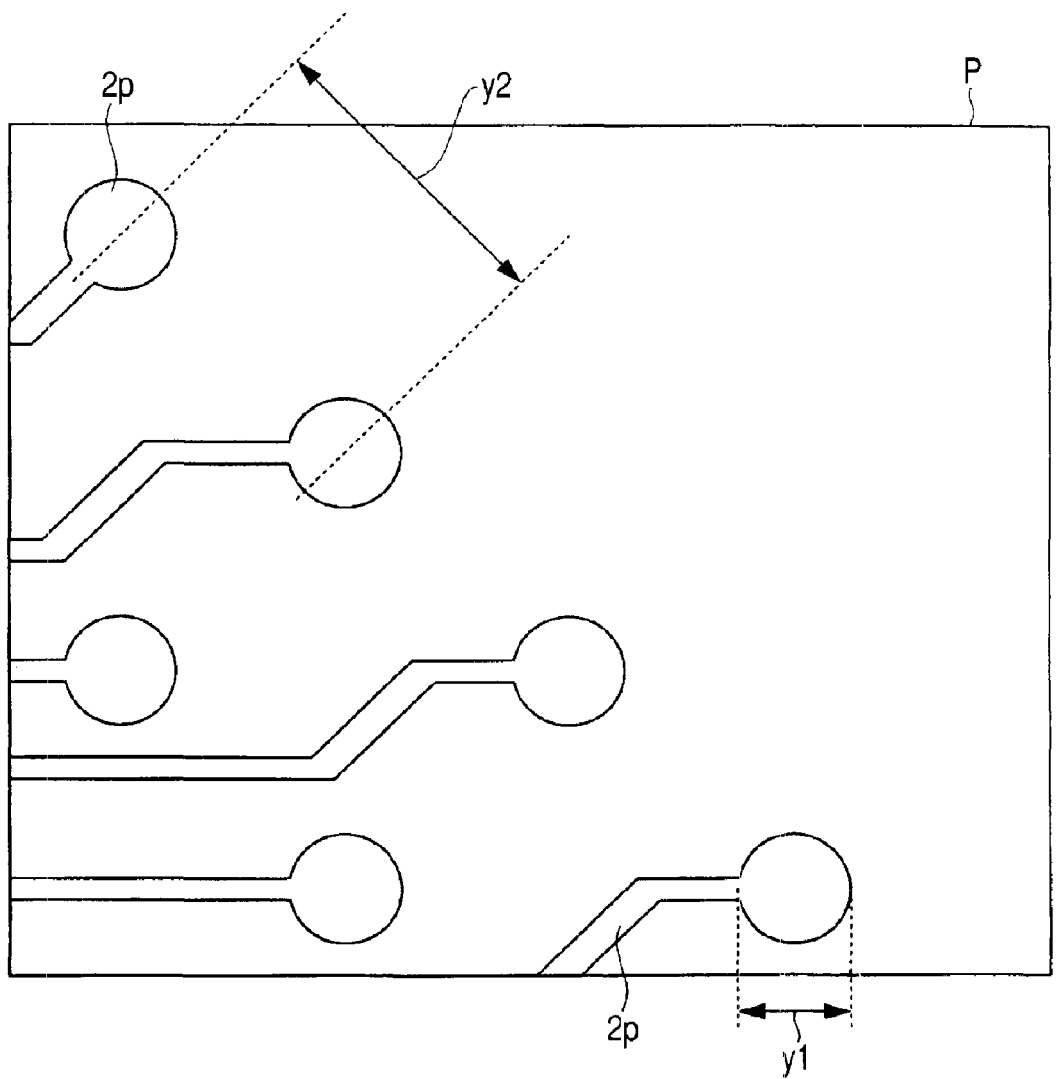
FIG. 7 is a diagram showing processing patterns in the design step after FIG. 6.

Subsequently, as shown in FIG. 7, real processing patterns 2p are formed in the region P by using a computer (S120). The real processing patterns 2p are the processing patterns of the redistribution interconnects 57 (real patterns 2) used as the above-described lead lines. The end portion of each of the real processing patterns 3p which will become the land electrode 2a has a circular planar shape and a diameter y1 of 108 µm and a pitch y2 of 180 µm.

Figure 8:
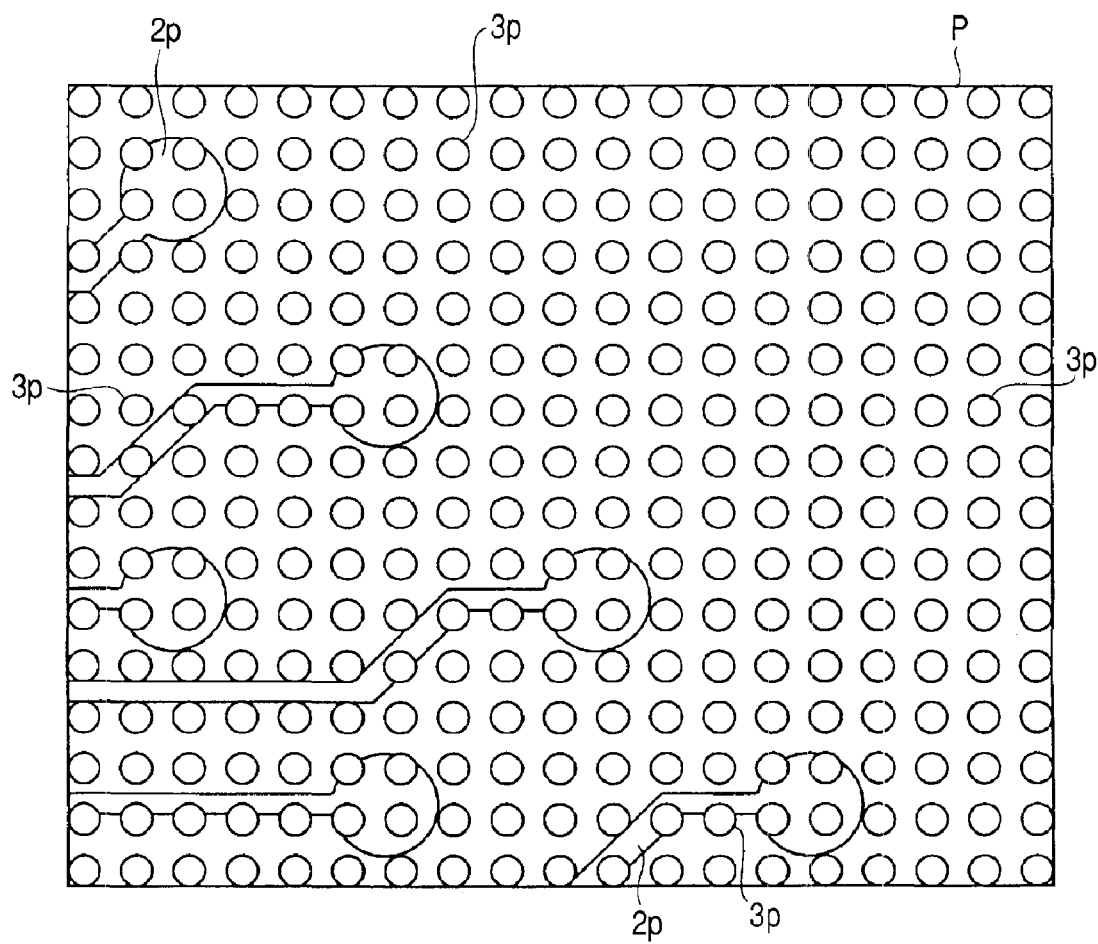
FIG. 8 is a diagram showing processing patterns in the design step after FIG. 7.
Figure 9:
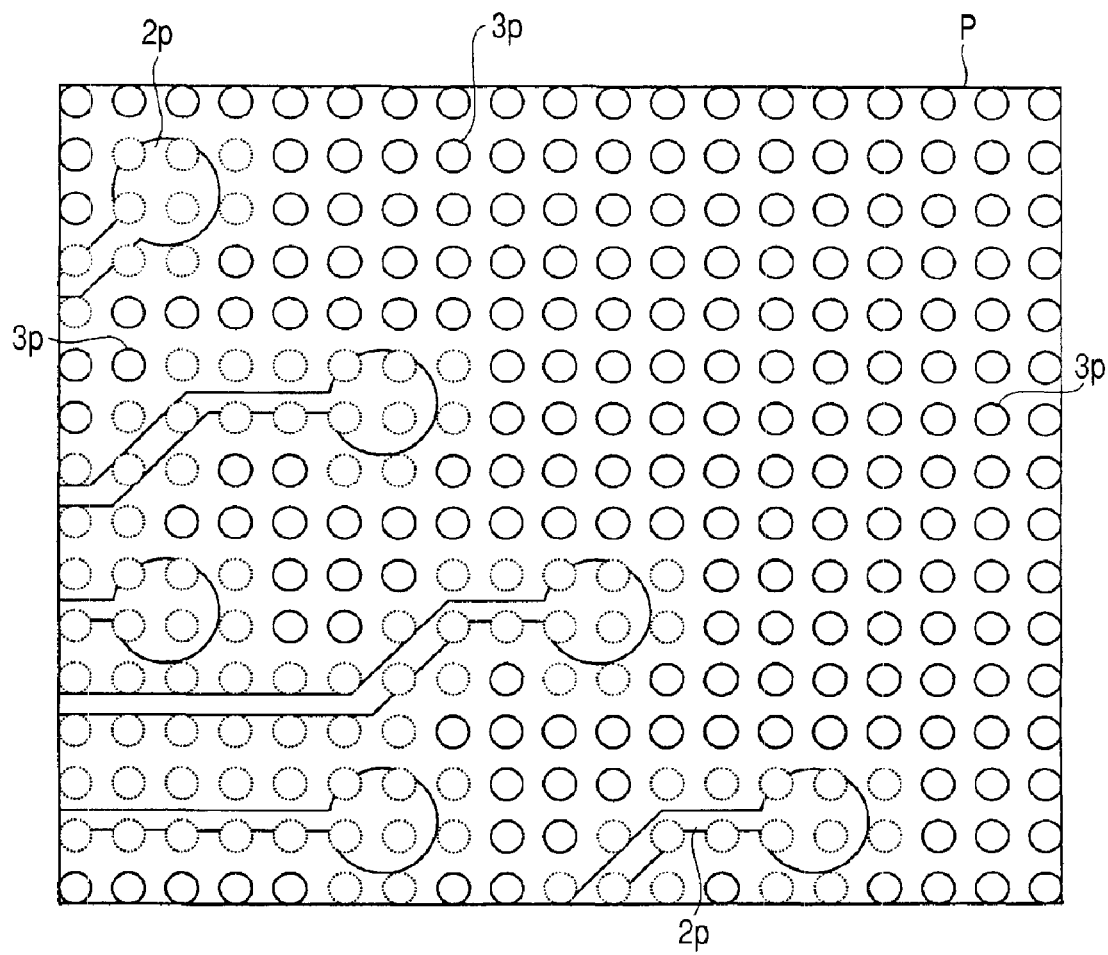
FIG. 9 is a diagram showing processing patterns in the design step after FIG. 8.
Figure 10:
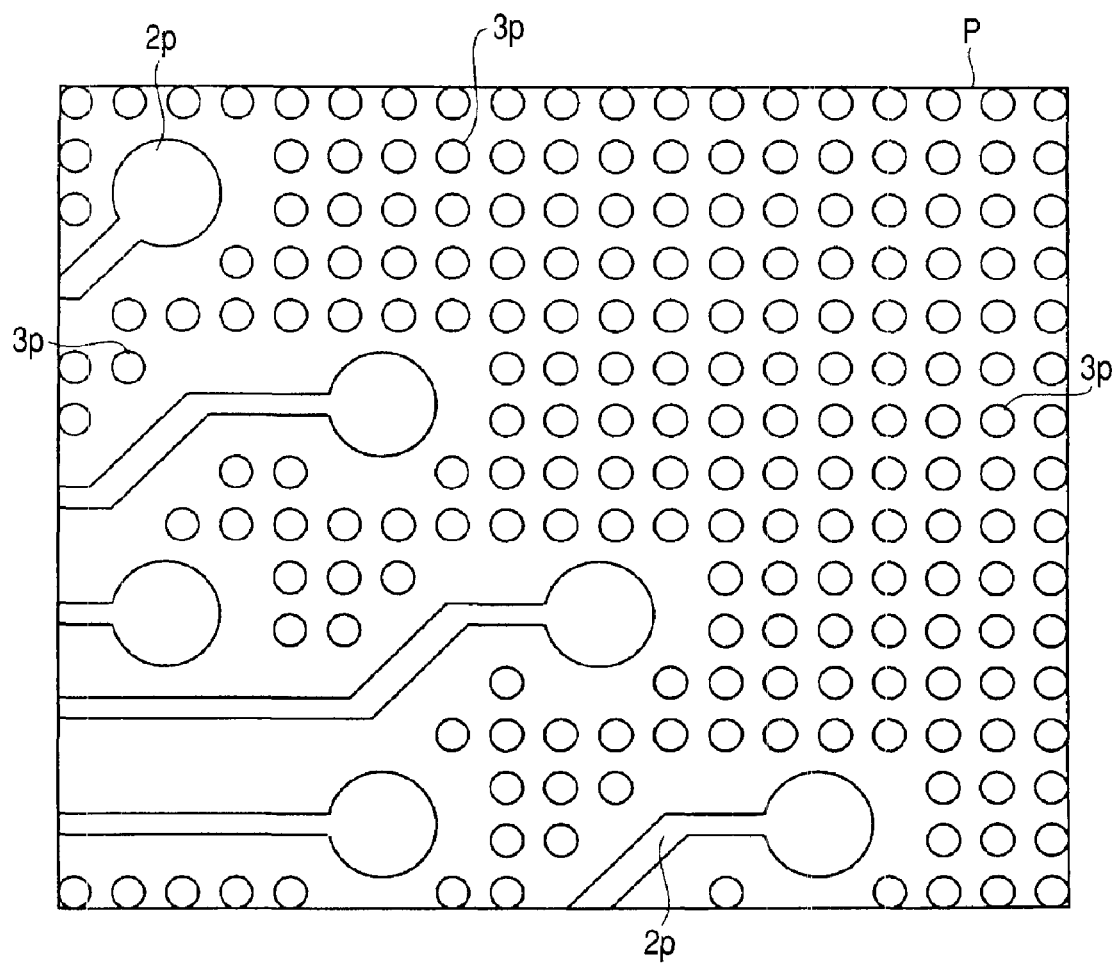
FIG. 10 is a diagram showing processing patterns in the design step after FIG. 9.

Subsequently, as shown in FIG. 8, the real processing patterns 2p and the dummy processing patterns 3p are combined together by using the computer (S130). Then, as shown in FIG. 9, the dummy processing patterns 3p (shown by the broken lines in the figure) in the specified space are calculated from the real processing patterns 2p by using the computer, and the dummy processing patterns 3p in the specified space region are deleted as shown in FIG. 10 (S140). Thereby, the difference in the density of the redistribution interconnects 57 configuring the real patterns 2 and the dummy patterns 3 is reduced as shown in FIG. 2.

Figure 11:
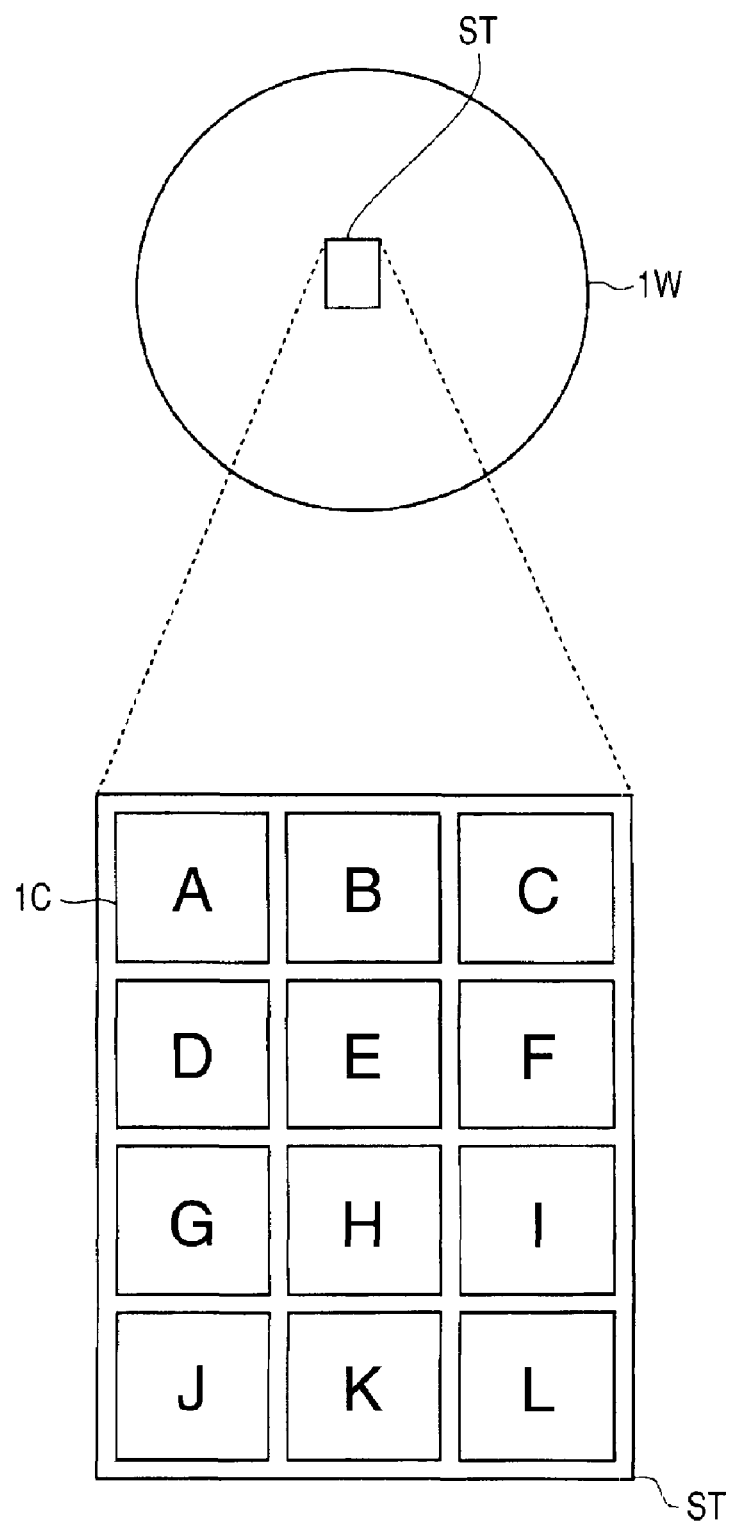
FIG. 11 is a plan view of the semiconductor device in the wafer step and the package step shown in FIG. 5.

A description is subsequently given of the wafer step (S200). As shown in FIG. 11, a substantially circular semiconductor wafer 1W having a plurality of chip regions (A to L) in a shot region ST is prepared (S210). An orientation flat is not shown in the semiconductor wafer 1W in FIG. 11.

In this embodiment, the semiconductor chips 1C are taken out from the chip regions (A to L) of the semiconductor wafer 1W. That is, the redistribution interconnects 47 comprised of the real patterns 2 and the dummy patterns 3 are formed in all the semiconductor chips 1C of the chip regions (A to L).

Figure 12:
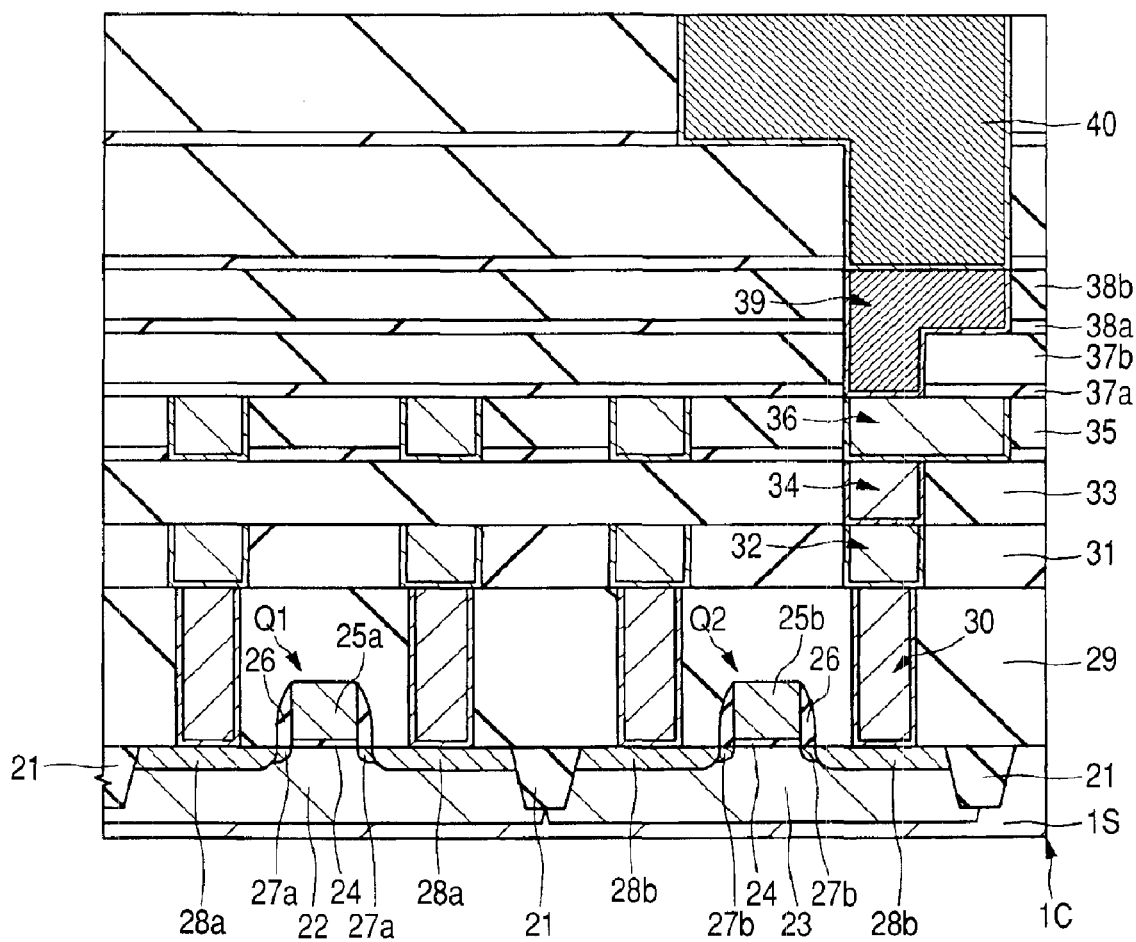
FIG. 12 is a sectional view of the semiconductor device after FIG. 11.

Subsequently, as shown in FIG. 12, semiconductor elements such as an n channel type MISFETQ1 and a p channel type MISFETQ2 are formed over the main surface of the semiconductor wafer 1W (to be referred to as "semiconductor substrate 1S" hereinafter) (S220). These MISFETs configure, for example, a high-speed SRAM or a logic circuit.

Element isolation regions 21 having an STI (Shallow Trench Isolation) structure are formed over the main surface of the semiconductor substrate 1S made of silicon monocrystals; and active regions are separated from one another by the element isolation regions 21. A p type well 22 is formed in a region in which the n channel type MISFETQ1 is to be formed out of the active regions, and an n type well 23 is formed in a region in which the p channel type MISFETQ2 is to be formed. The p type well 22 is a semiconductor region into which a p type impurity such as boron (B) has been introduced and the n type well 23 is a semiconductor region into which an n type impurity such as phosphorus (P) or arsenic (As) has been introduced.

The n channel type MISFETQ1 is formed over the p type well 22. The configuration of this n channel type MISFETQ1 is as follows. That is, a gate insulating film 24 is formed over the p type well 22 and a gate electrode 25a is formed over this gate insulating film 24. The gate insulating film 24 is, for example, a silicon oxide film and may be a high dielectric film having a higher dielectric constant than the silicon oxide film. The gate electrode 25a is made of, for example, a polysilicon film into which an n type impurity has been introduced. This is carried out to reduce the threshold voltage of the n channel type MISFETQ1.

A side wall 26 is formed on the both sides of the gate electrode 25a, and low-concentration n type impurity diffusion regions 27a are formed in the p type well 22 below the side walls 26. High-concentration n type impurity diffusion regions 28a are formed on the outer sides of the low-concentration n type impurity diffusion regions 27a. The low-concentration n type impurity diffusion regions 27a and the high-concentration n type impurity diffusion regions 28a are semiconductor regions into which an n type impurity has been introduced and the n type impurity is introduced into the high-concentration n type impurity diffusion regions 28a in a higher concentration than the low-concentration n type impurity diffusion regions 27a. The source region or the drain region of the n channel type MISFETQ1 is formed by the low-concentration n type impurity diffusion regions 27a and the high-concentration n type impurity diffusion regions 28a. A so-called LDD (Lightly Doped Drain) structure is formed by composing the source region or the drain region from the low-concentration n type impurity diffusion regions 27a and the high-concentration n type impurity diffusion regions 28a. Therefore, the concentration of an electric field below the gate electrode 25a can be eased.

Meanwhile, the p channel type MISFETQ2 is formed over the n type well 23. The configuration of this p channel type MISFETQ2 is almost the same as that of the n channel type MISFETQ1. That is, the gate insulating film 24 is formed over the n type well 23 and a gate electrode 25b is formed over this gate insulating film 24. The gate electrode 25b is made of, for example, a polysilicon film into which a p type impurity has been introduced. The threshold voltage of the p channel type MISFETQ2 can be reduced by introducing the p type impurity into the gate electrode 25b. In this Embodiment 1, the n type impurity is introduced into the gate electrode 25a of the n channel type MISFETQ1 whereas the p type impurity is introduced into the gate electrode 25b of the p channel type MISFETQ2. Therefore, it is possible to reduce the threshold voltages of both the n channel type MISFETQ1 and the p channel type MISFETQ2.

A side wall 26 is formed on the both sides of the gate electrode 25b, and low-concentration p type impurity diffusion regions 27b are formed in the n type well 23 below the side walls 26. High-concentration p type impurity diffusion regions 28b are formed on the outer sides of the low-concentration p type impurity diffusion regions 27b. The low-concentration p type impurity diffusion regions 27b and the high-concentration p type impurity diffusion regions 28b are semiconductor regions into which a p type impurity has been introduced and the p type impurity is introduced into the high-concentration p type impurity diffusion regions 28b in a higher concentration than the low-concentration p type impurity diffusion regions 27b. The source region or the drain region of the p channel type MISFETQ2 is formed by the low-concentration p type impurity diffusion regions 27b and the high-concentration p type impurity diffusion regions 28b.

Thus, semiconductor elements such as the n channel type MISFETQ1 and the p channel type MISFETQ2 are formed over the semiconductor substrate 1S in the semiconductor device in this embodiment.

Subsequently, multi-layer interconnects are formed over the semiconductor substrate 1S (S230). As shown in FIG. 12, a silicon oxide film 29 which is an interlayer insulating film is formed over the n channel type MISFETQ1 and the p channel type MISFETQ2 overlying the semiconductor substrate 1S. Plugs 30 reaching the source region and the drain region of the n channel type MISFETQ1 or the p channel type MISFETQ2 are formed in the silicon oxide film 29. The plugs 30 are made of a film stack of a titanium nitride film and a tungsten film which are barrier metal films.

A silicon oxide film 31 which is an interlayer insulating film is formed over the silicon oxide film 29 having the plugs 30 and first-layer interconnects 32 are embedded in this silicon oxide film 31. The first-layer interconnects 32 are made of, for example, a tungsten film and electrically coupled to the plugs 30 formed in the underlying layer.

A silicon oxide film 33 is formed over the first-layer interconnects 32 and a plug 34 is embedded in this silicon oxide film 33. The plug 34 is also made of a film stack of a barrier metal film and a tungsten film like the plugs 30. The plug 34 is electrically coupled to the first-layer interconnect 32 formed in the underlying layer.

A silicon oxide film 35 which is an interlayer insulating film is formed over the silicon oxide film 33 having the plug 34 and second-layer interconnects 36 are embedded in this silicon oxide film 35. The second-layer interconnects 36 are made of a film stack of a barrier metal film for preventing the diffusion of copper and a copper (copper or alloy thereof) film.

A silicon nitride film 37a for preventing the diffusion of copper is formed over the second-layer interconnects 36, and a silicon oxide film 37b is formed over this silicon nitride film 37a. A film stack of a silicon nitride film 38a and a silicon oxide film 38b is formed over the silicon oxide film 37b, and a third-layer interconnect 39 is embedded in the silicon nitride film 38a and the silicon oxide film 38b. This third-layer interconnect 39 is made of a film stack of a barrier metal film for preventing the diffusion of copper and a copper film and electrically coupled to the second-layer interconnect 36 formed in the underlying layer.

Like the third-layer interconnect 39, a fourth-layer interconnect 40 made of a film stack of a barrier metal film for preventing the diffusion of copper and a copper film is formed over the third-layer interconnect 39. This fourth-layer interconnect 40 is electrically coupled to the third-layer interconnect 39 formed in the underlying layer. Not shown, a plurality of fuses for saving memories may be formed in the same layer as the fourth-layer interconnect 40 at fixed intervals. The fuses are electrically coupled to a redundancy relief circuit so that an address signal for selecting a defective memory cell can be changed to an address signal corresponding to a redundancy relief memory cell by cutting a specific fuse.

Figure 13:
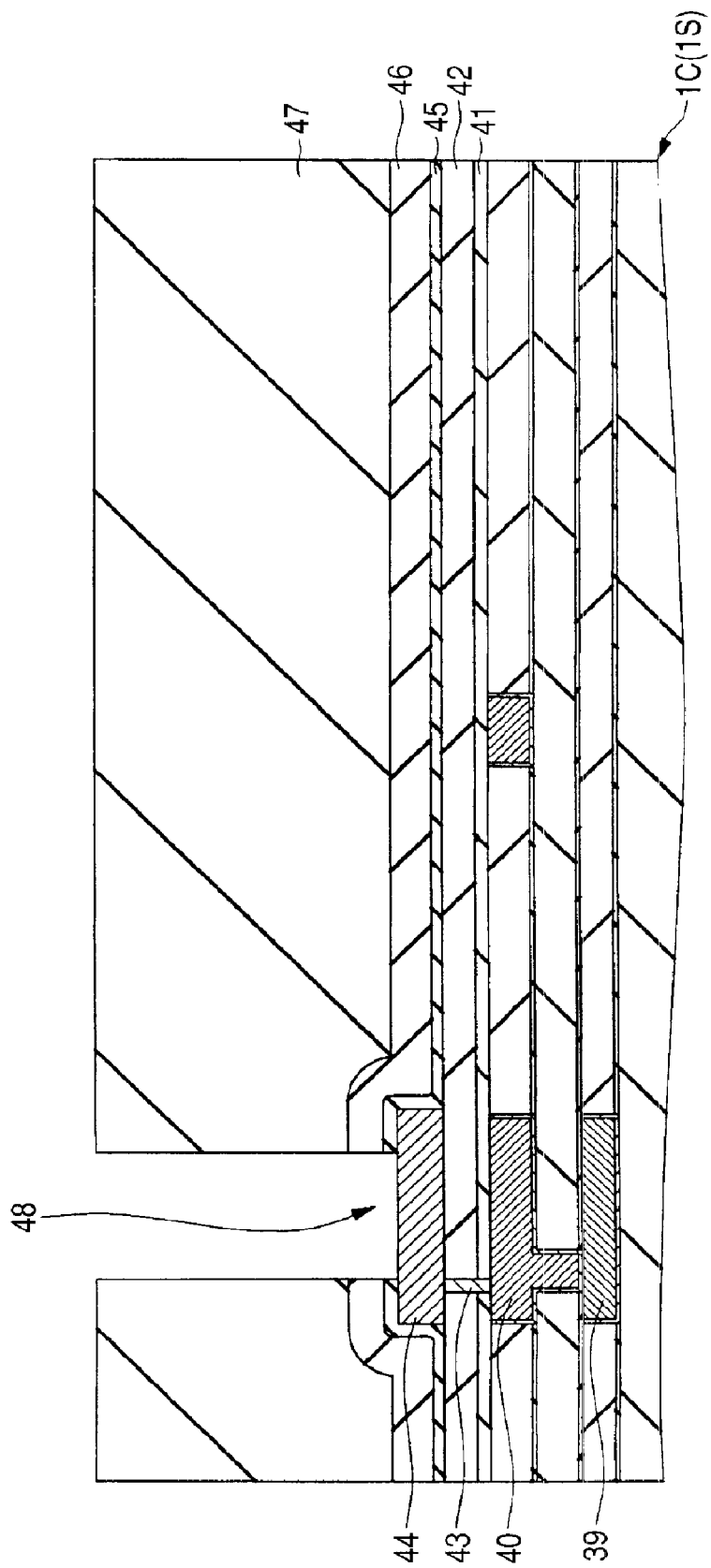
FIG. 13 is a sectional view of the semiconductor device after FIG. 12.

A cap insulating film 41 is formed over the semiconductor substrate 1S to cover the fourth-layer interconnect 40 so as to prevent the diffusion of copper of the fourth-layer interconnect 40 into upper layers, and a silicon oxide film 42 is formed over this cap insulating film 41 by, for example, plasma CVD (see FIG. 13). The cap insulating film 41 is a silicon nitride film, and the time dependent dielectric breakdown (TDDB) resistance of the cap insulating film 41 and the electromigration resistance of the fourth-layer interconnect 40 can be improved when a SiCN film is used as the silicon nitride film as compared with a case where a SiN film is used.

A plug 43 electrically coupled to the fourth-layer interconnect 40 is formed in the silicon oxide film 42 and the cap insulating film 40. This plug 43 can be formed by dry etching the silicon oxide film 42 and the cap insulating film 41 by using a mask (photoresist film), forming a connection hole reaching the fourth-layer interconnect 40, depositing a titanium (Ti) film, a titanium nitride (TiN) film or a film stack thereof over the silicon oxide film 42 including the inside of the connection hole as a barrier conductive film, filling a tungsten film in the connection hole and removing the tungsten film and the barrier conductive film outside the connection hole by CMP or the like.

A fifth-layer interconnect 44 electrically coupled to the plug 43 is formed over the plug 43 above the fourth-layer interconnect 40. This fifth-layer interconnect 44 comprises aluminum (Al) as the main conductive layer and has a structure that the Al film as the main conductive layer is sandwiched between barrier conductive films which is comprised of a Ti film and a TiN film. This interconnect can be formed by depositing the lower barrier conductive film, the Al film and the upper barrier conductive film sequentially and dry etching these laminated films by photolithography using a patterned photoresist film as a mask.

In this embodiment, the multi-layer interconnects are comprised of the first-layer interconnect 32, the second-layer interconnect 36, the third-layer interconnect 39, the fourth-layer interconnect 40 and the fifth-layer interconnect 44. The multi-layer interconnects serve to form a circuit by electrically coupling a plurality of semiconductor elements.

Subsequently, for example, a thin silicon oxide film 45 and a thin silicon nitride film 46 are formed as passivation films over the semiconductor substrate 1S, that is, the silicon oxide film 42 to cover the multi-layer interconnects (S240). The silicon oxide film 45 and the silicon nitride film 46 are inorganic insulating films and can be formed by, for example, plasma CVD.

Subsequently, the silicon nitride film 46 and the silicon oxide film 45 are dry etched by photolithography using a patterned photoresist film 47 as a mask to form an opening portion 48 from which part of the fifth-layer interconnect is exposed. Thereafter, the photoresist film 47 is removed by ashing (carbonization).

Figure 14:
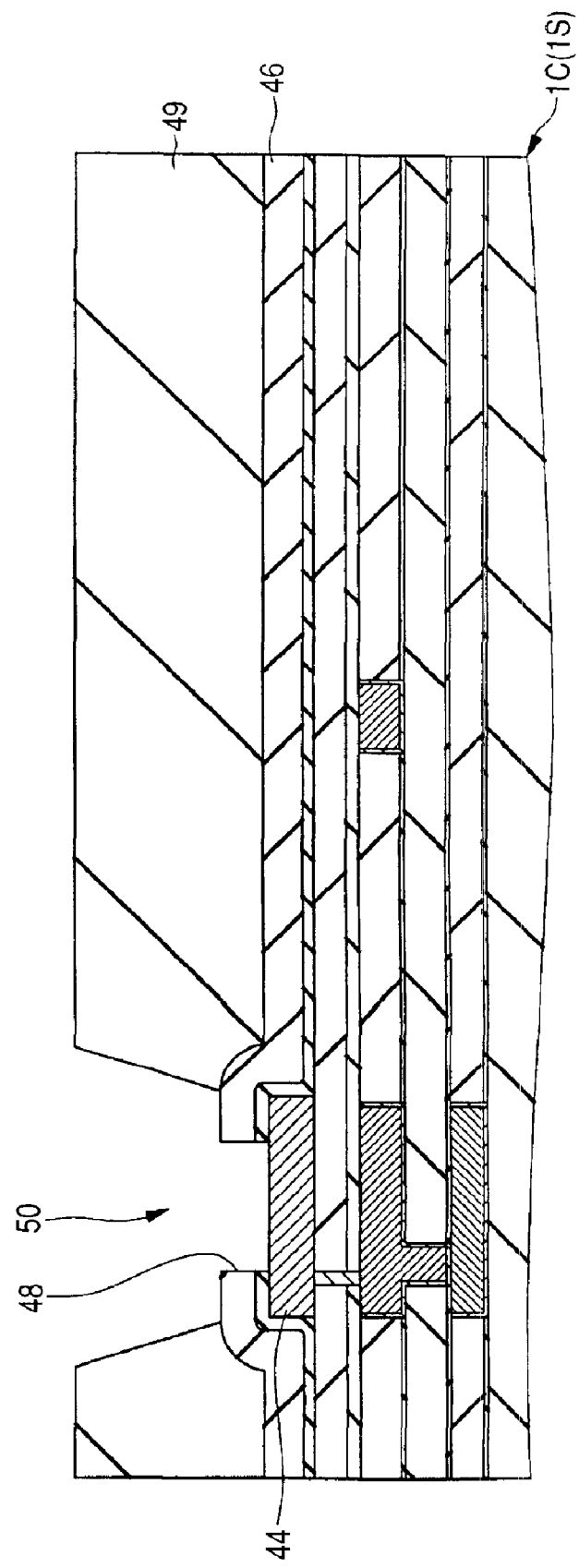
FIG. 14 is a sectional view of the semiconductor device after FIG. 13.

Subsequently, as shown in FIG. 14, a polyimide resin film 49 which is an organic insulating film is formed as an insulating film over the silicon nitride film 46 (S250). This polyimide resin film 49 configures a surface protective film (insulating film) for protecting the semiconductor elements and the multi-layer interconnects of the semiconductor substrate 1S.

A description is subsequently given of the package step (S300). As shown in FIG. 14, the polyimide resin film 49 is patterned by exposure and ashing to remove the polyimide resin film 49 above the opening portion 48. Thereby, an opening portion 50 from which part of the fifth-layer interconnect 44 is exposed is formed in the silicon oxide film 45, the silicon nitride film 46 and the polyimide resin film 49 over part of the fifth-layer interconnect 44 (S310).

Figure 15:
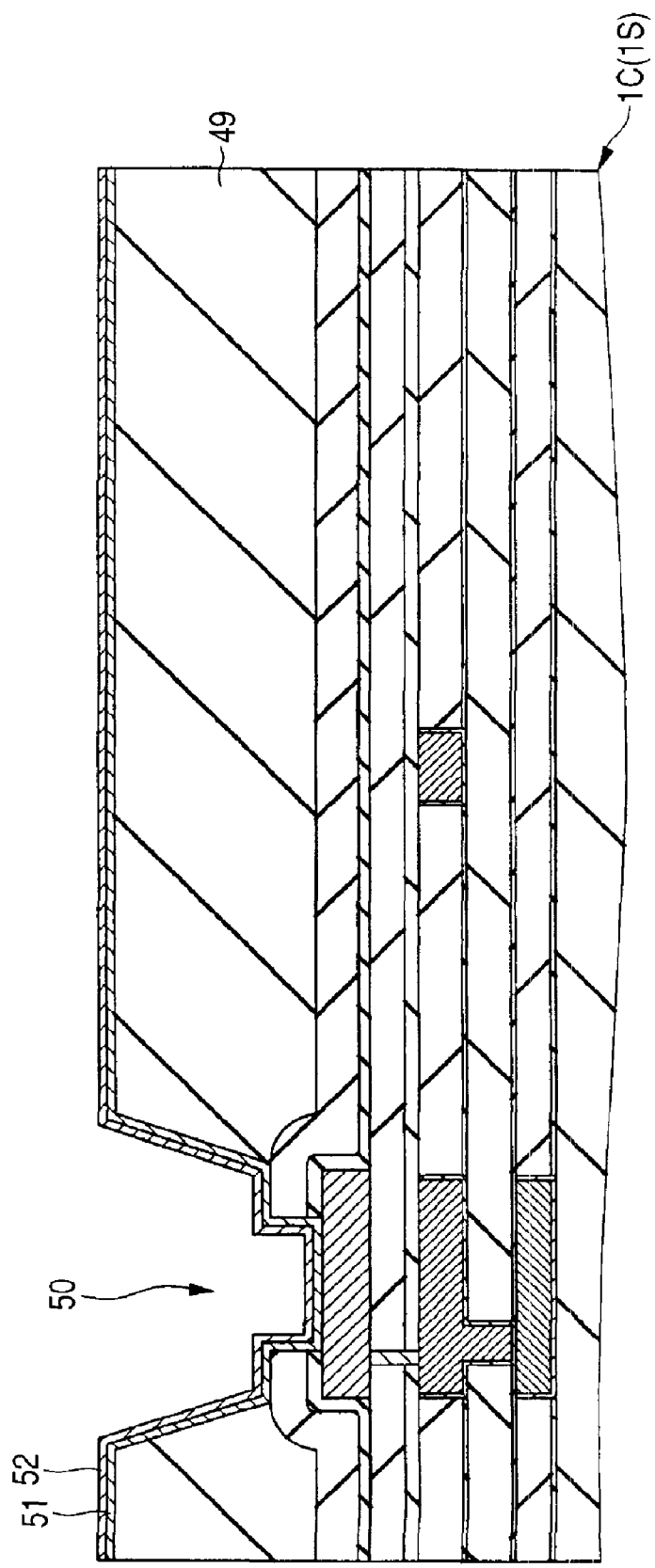
FIG. 15 is a sectional view of the semiconductor device after FIG. 14.

Subsequently, as shown in FIG. 15, after sputter etching is carried out on the surface of the semiconductor substrate 1S, a TiN film and a Ti film are formed in the opening portion 50 and over the polyimide resin film 49 sequentially by sputtering to form a barrier layer 51. A copper (Cu) film is deposited over the barrier layer 51 by sputtering to form a seed layer 52. This seed layer 52 is a seed layer for redistribution interconnects which will be formed by using the plating process in the subsequent step.

Figure 16:
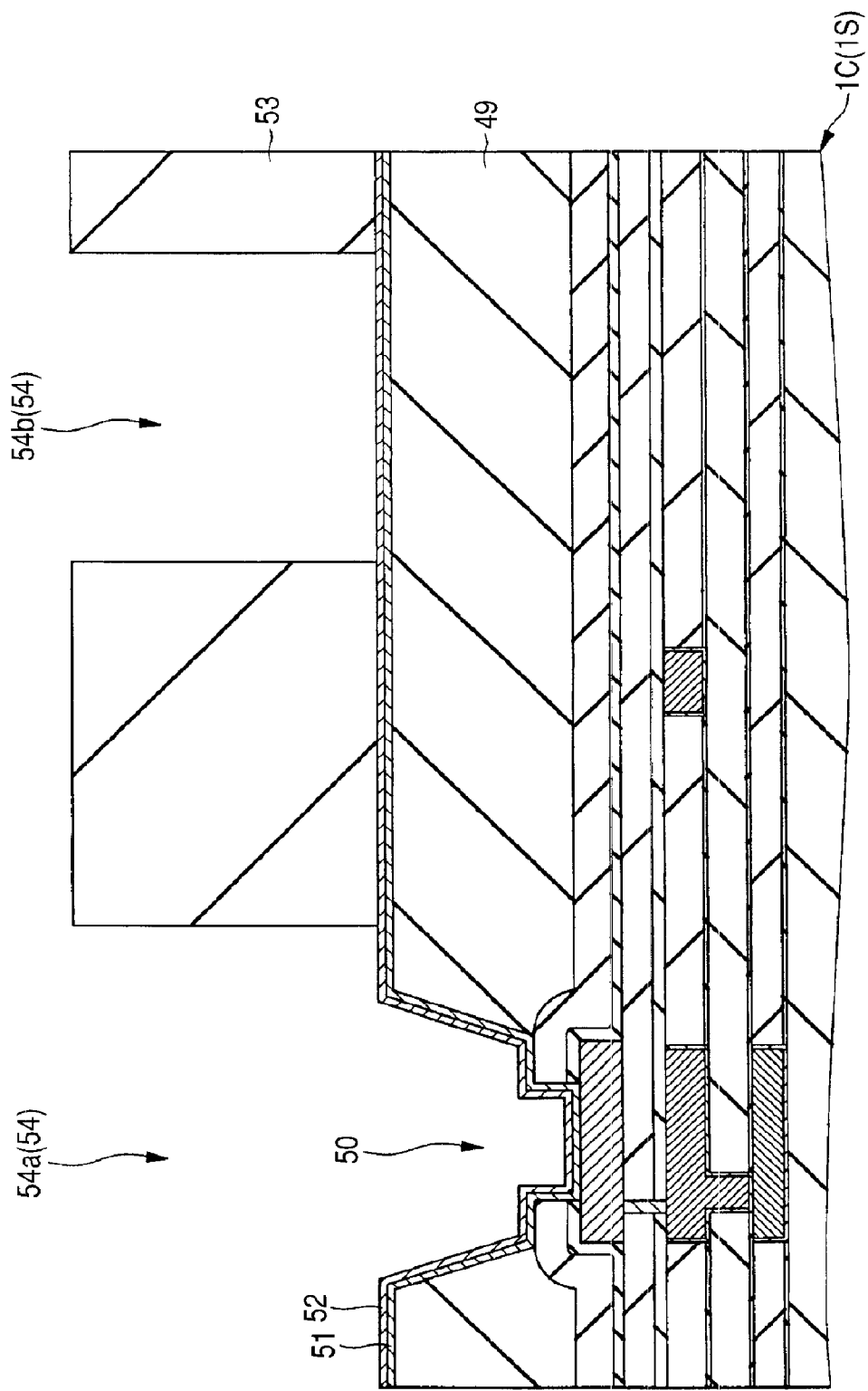
FIG. 16 is a sectional view of the semiconductor device after FIG. 15.

Subsequently, as shown in FIG. 16, a photoresist film 53 is formed over the semiconductor substrate 1S by coating and patterned by photolithography. Thereby, opening portions 54 for forming redistribution interconnects from which part of the seed layer 52 is exposed are formed in the photoresist film 53 overlying part of the seed layer 52. Out of the opening portions 54, an opening portion 54a is formed to expose the opening portion 50 formed by removing part of the polyimide resin film 49 and an opening portion 54b is formed over the polyimide resin film 49. The opening portions 54 are used to form the retribution interconnect patterns shown in FIG. 1 and FIG. 2, the opening portion 54a becomes the real pattern 2a, and the opening portion 54b becomes the dummy pattern 3.

Figure 17:
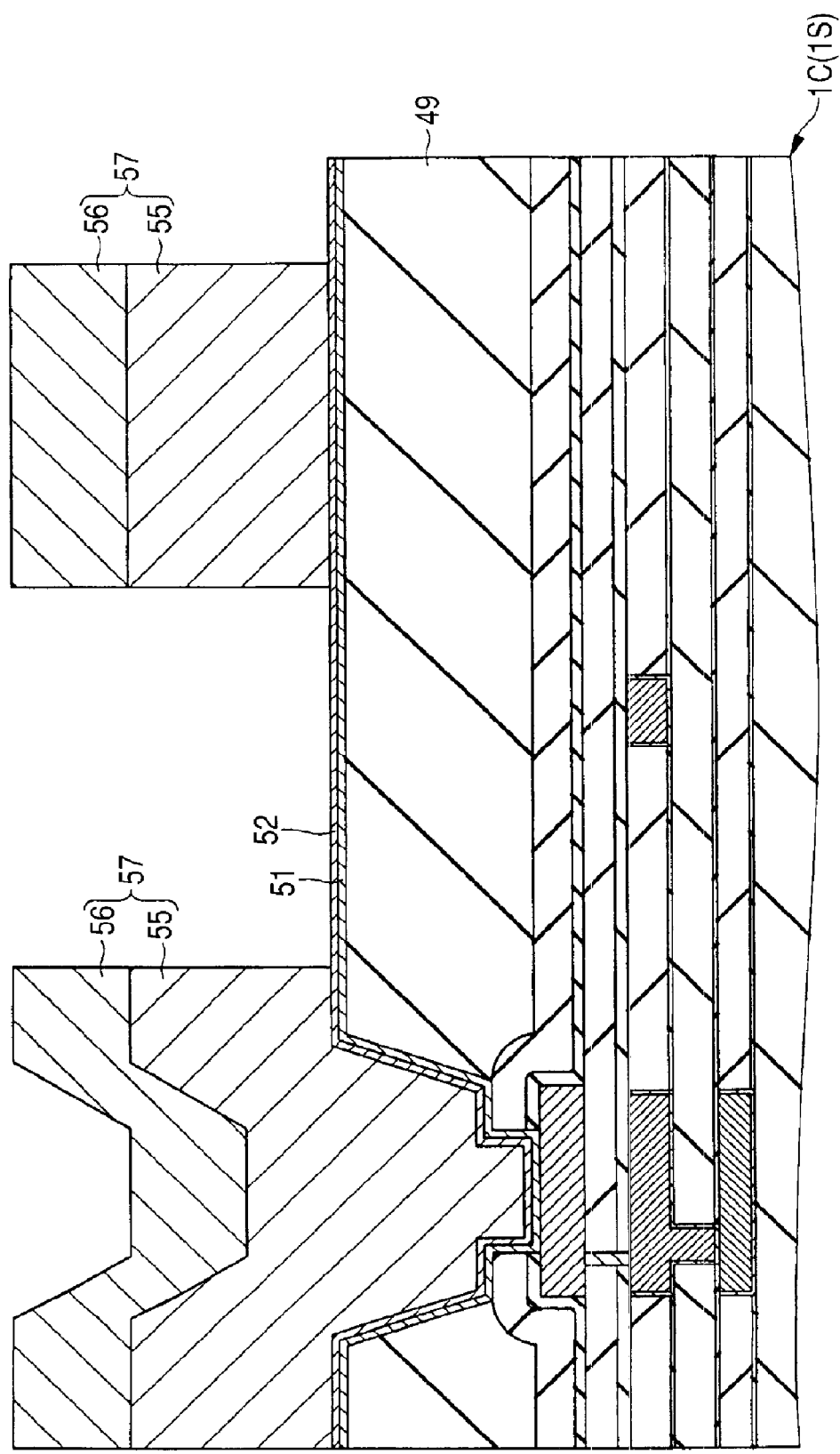
FIG. 17 is a sectional view of the semiconductor device after FIG. 16.

Subsequently, when a copper film 55 and a nickel film 56 are deposited sequentially by the electrolytic plating process using the patterned photoresist film 53 as a mask to form redistribution interconnects 57 comprised of the copper film 55 and the nickel film 56, and then the photoresist film 53 is removed by ashing, the redistribution interconnects 57 shown in FIG. 17 are obtained (S320). The redistribution interconnects 57 are formed in such a manner that the real patterns 2 and the dummy patterns are coexistent within the plane of the semiconductor substrate 1S as shown in FIG. 1 and FIG. 2.

Figure 18:
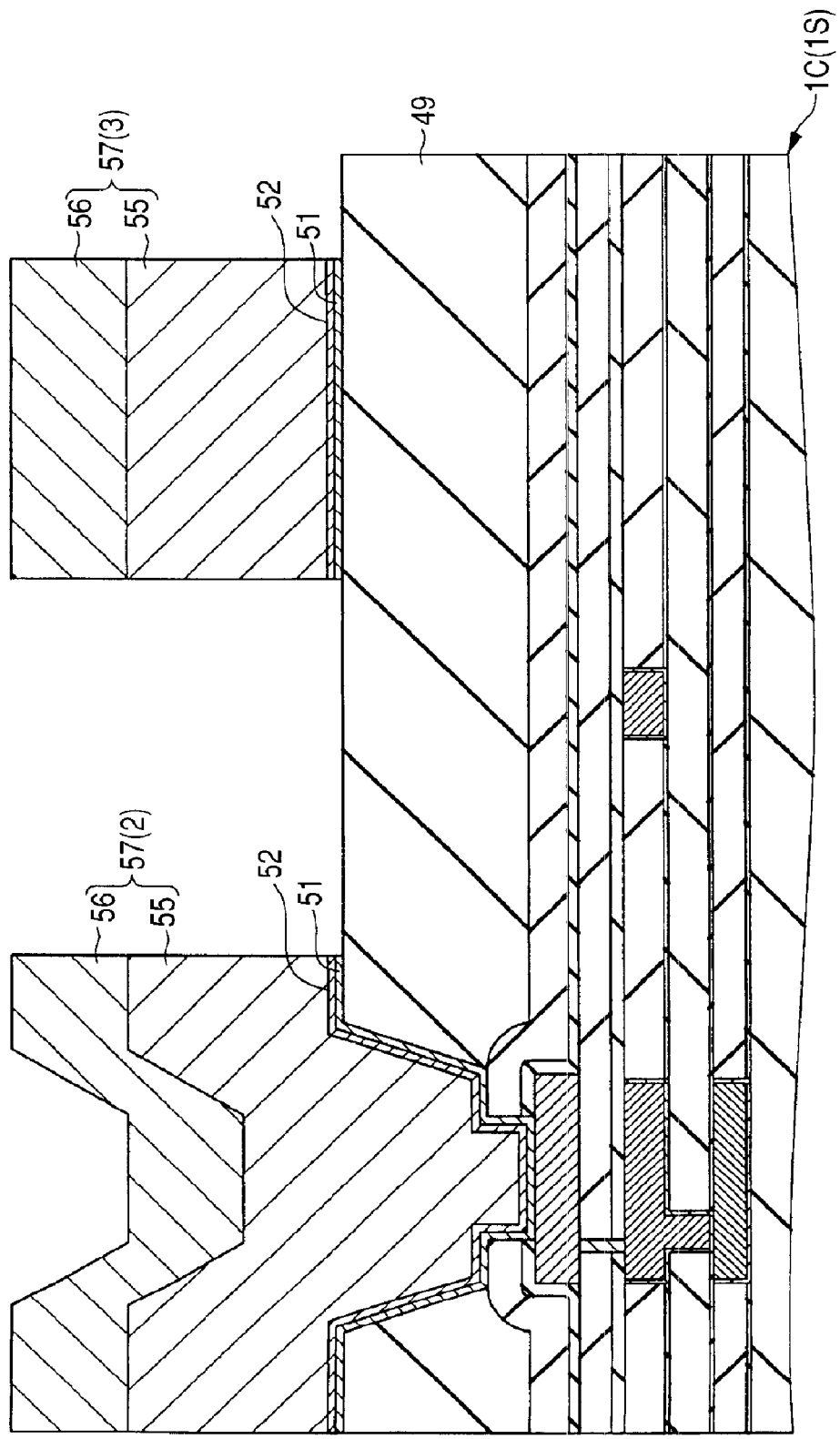
FIG. 18 is a sectional view of the semiconductor device after FIG. 7.

Subsequently, as shown in FIG. 18, by wet etching (cleaning) the seed layer 52 and the barrier layer 51 using the redistribution interconnects 57 as a mask, the seed layer 52 and the barrier layer 51 underlying the redistribution interconnects 57 are left behind and the seed layer 52 and the barrier layer 51 excluding these portions are removed.

Subsequently, after the polyimide resin film 58 which is an organic insulating film is formed as a surface protective film (insulating film) over the semiconductor substrate 1S to cover the redistribution interconnects 57 (S330) as shown in FIG. 3, the opening portion 59 from which part of the real pattern 2 is exposed is formed in the polyimide resin film 58 over part of the real pattern 2 (land electrode 2a) comprised of the redistribution interconnect 57 (S340). The opening portion 59 is formed by patterning the polyimide resin film 58 by exposure and ashing and removing the polyimide resin film 58 over the land electrode 2a of the real pattern 2.

Then, an unshown gold (Au) film is formed over the land electrode 2a at the bottom of the opening portion 59 by the electroless plating process. After solder paste is printed on the semiconductor substrate 1S by solder printing, the solder paste is molten and recrystallized by a reflow treatment to form a bump electrode 60 over the above gold film (S350). Pb (lead)-free solder formed from Sn (tin), Ag (silver) and Cu may be used as the solder paste. Alternatively, after a solder ball molded spherically is supplied into the opening portion 59 instead of using the solder paste, the bump electrode 60 can be formed by carrying out a reflow treatment on the semiconductor substrate 1S. The above gold film is not diffused into the bump electrode 60 by the reflow treatment of the solder paste.

Thereafter, the semiconductor substrate 1S in the form of a wafer is cut along scribe (dicing) regions between the defined chip regions to be divided into individual semiconductor chips 1C shown in FIG. 1, thereby completing a semiconductor device in this embodiment. The semiconductor chip 1C in this embodiment can be mounted on a package substrate via the bump electrodes 60. After the semiconductor chip 1C is mounted on the package substrate, the bump electrodes 60 are reflowed and an underfill resin is filled into the space between the semiconductor chip 1C and the package substrate to manufacture a semiconductor device.

Here, the occupation ratio in the local region in the semiconductor wafer 1W of the redistribution interconnects 57 configuring the real patterns 2 and dummy patterns 3, for example, the occupation ratio in the semiconductor chip 1C, and the occupation ratio in the shot region ST is described.

When the occupation ratio of the redistribution interconnects 57 in the semiconductor chip 1C (shot region ST) becomes low, plating stability, that is, a stable current value cannot be ensured, whereby the thickness of the plating film (copper film 55/nickel film 56) configuring the redistribution interconnects 57 may become nonuniform within the plane of the semiconductor wafer 1W, or the surface of the center portion of the semiconductor wafer 1W may become rough. As already explained with reference to FIG. 4, when the occupation ratio of the redistribution interconnects 57 is locally nonuniform, a roughened surface is formed at the end portions of the redistribution interconnects 57 (real patterns 2) near the boundary between the peripheral region 90 where the real patterns 2 are formed (the region where the redistribution interconnects 57 are dense) and the central region 80 where the real patterns 2 are not formed (the region where the redistribution interconnects 57 are sparse).

Meanwhile, when the occupation ratio of the redistribution interconnects 57 within the plane of the semiconductor wafer 1W becomes high, the semiconductor wafer 1W warps due to the relationship with the thickness of the semiconductor wafer 1W after back grinding. Therefore, the bump electrodes 60 cannot be formed after back grinding. Or, the semiconductor wafer 1W cannot be handled, chipping occurs and the yield of the post-process drops.

Then, in this embodiment, the dummy patterns 3 are formed in addition to the real patterns 2 in the redistribution interconnects 57 using the WPP technology, and the upper limit and lower limit of the total occupation ratio (occupation ratio in the local region) in the shot region ST (semiconductor chip 1C) of the redistribution interconnects 57 comprised of the real patterns 2 and the dummy patterns 3 are specified to stabilize the step of forming the redistribution interconnects 57 and work after back grinding and handling, thereby reducing the production yield of the semiconductor device.

Figure 19:
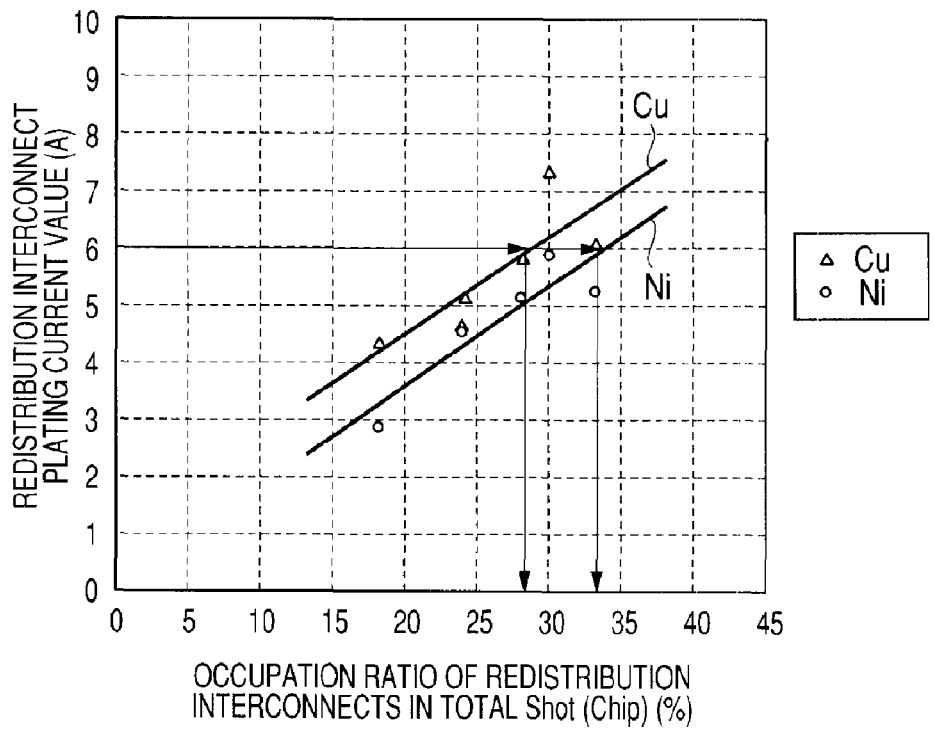
FIG. 19 is a diagram showing the relationship between the plating current and the occupation ratio of redistribution interconnects.
Figure 20:
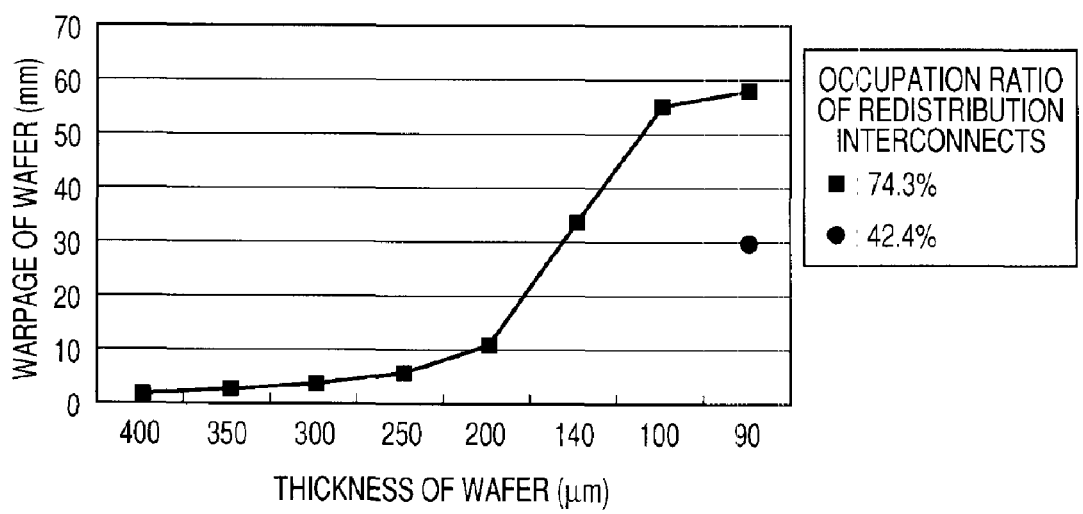
FIG. 20 is a diagram showing the relationship between the thickness of a semiconductor wafer and the warpage of the semiconductor wafer.

For instance, it is necessary to ensure a plating current value of 6 A or more for a plating device used in this embodiment to form the plating film (the copper film 55 and the nickel film 56 configuring the redistribution interconnects 57) stably. There is correlation between the plating current and the occupation ratio of the redistribution interconnects 57 within the plane of the semiconductor wafer 1W as shown in FIG. 19. When the plating current is 6 A, it is understood that the occupation ratio of the copper film 55 is 28.5% in order to form a stable plating film of copper (Cu). When the plating current is 6 A, it is understood that the occupation ratio of the nickel film 56 is 33.4% in order to form a stable plating film of nickel (Ni).

Therefore, in this embodiment, the lower limit of the occupation ratio of the redistribution interconnects 57 in the shot region ST (semiconductor chip 1C) including a margin is set to 35% or more. Thereby, the redistribution interconnects 57 can be formed stably and the production yield can be reduced. A product defect can be suppressed by preventing the end surfaces of the stably formed redistribution interconnects 57 from being roughened, thereby making it possible to improve the reliability of the semiconductor device.

When the mass-production of the semiconductor device is taken into consideration, it is desired that the warpage of the semiconductor wafer 1W having the bump electrodes 60 should be 50 mm or less. It is understood from the relationship between the thickness of the semiconductor wafer 1W having a diameter of 300 mm and the warpage of the semiconductor wafer 1W shown in FIG. 20 that when the occupation ratio of the redistribution interconnects 57 is 74.3%, as the semiconductor wafer 1W becomes thinner, the warpage of the semiconductor wafer 1W increases. In this case, the thickness of the semiconductor wafer 1W having a warpage of 50 m or less is 120 μm.

When a reduction in the size of the semiconductor device is taken into consideration, it is desired that the thickness of the semiconductor wafer 1W (semiconductor chip 1C) should be smaller, and the lower limit of the thickness of the current product of the semiconductor wafer 1W is 100 μm. Therefore, in this embodiment, the upper limit of the occupation ratio of the redistribution interconnects 57 in the shot region ST (semiconductor chip 1C) is set to 60% or less from the results obtained when the warpage of the semiconductor wafer 1W is 50 mm or less and the thickness of the semiconductor wafer 1W is 100 μm or less. Thereby, the bump electrodes 60 can be formed stably after back grinding. The semiconductor wafer W can be easily handled by suppressing its warpage. Since the chipping and cracking of the semiconductor wafer 1W can be prevented, the production yield of the semiconductor device can be reduced.

Embodiment 2

In the above Embodiment 1, the redistribution interconnects comprised of the real patterns which are lines drawn from internal circuits and the floating dummy patterns are formed in all the chip regions in the shot region. In this embodiment, redistribution interconnects comprised of real patterns and dummy patterns are formed in some of the chip regions in the shot region. An explanation overlapped with the above embodiment is omitted.

For example, a case where various test chips are arranged in a plurality of chip regions (A to L) in the shot region ST shown in FIG. 11 will be described. In the shot region ST, test chips requiring the WPP technology are formed in certain chip regions (E, F, H) and test chips requiring no WPP technology are formed in other chip regions (A, B, C, G, I, J, K, L). That is, semiconductor chips requiring the WPP technology and semiconductor chips requiring no WPP technology are coexistent in the shot region ST.

Since the WPP technology is carried out on the wafer, in this embodiment, dummy patterns are formed on not only the test chips which require the WPP technology but also the test chips which do not require the WPP technology to satisfy the requirement for the occupation ratio of the redistribution interconnects in the shot region as described in the above Embodiment 1.

FIG. 21 shows the key sections of the chip region E and the chip region A in the shot region ST in this embodiment. The chip region E shown in FIG. 21 corresponds to the region shown in FIG. 2. That is, the semiconductor chip 1C shown in the above Embodiment 1 is formed as a test chip in the chip region E in FIG. 21. Therefore, the section of the semiconductor chip 1C in the chip region E is shown in FIG. 3.

Figure 22:
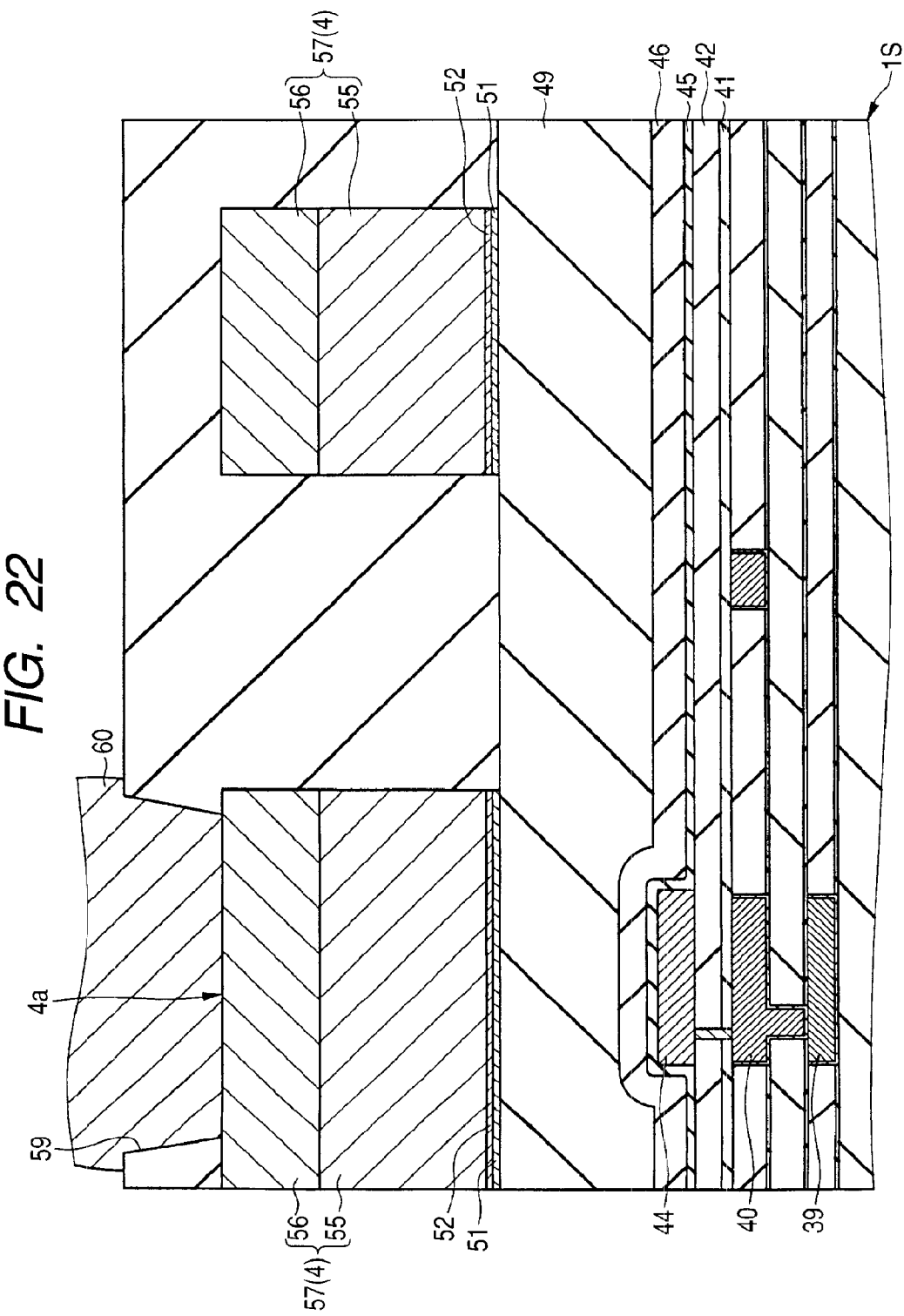
FIG. 22 is a sectional view of the key section of the semiconductor device shown in FIG. 21.

Meanwhile, FIG. 22 is a sectional view of the semiconductor chip in the chip region A. Since the WPP technology is not required, when the semiconductor chip is formed in the same manner as in the wafer step (S200) shown in FIG. 5, the semiconductor elements (S220), the multi-layer interconnects (S230) including the third-layer interconnect 39, the fourth-layer interconnect 40 and the fifth-layer interconnect 44, the silicon oxide film 45 and the silicon nitride film 46 (S240) which are organic insulating films, and the polyimide resin film 49 (S250) which is an organic insulating film may be formed in the semiconductor chip in the chip region A. However, in this embodiment, dummy patterns 4 comprised of the redistribution interconnects 57 are formed in the chip region A to satisfy the requirement for the occupation ratio of the redistribution interconnects in the shot region ST as described in the above Embodiment 1. The dummy patterns 4 can be formed in the same manner as the dummy patterns 3 in the above embodiment.

Dummy land electrodes 4a are also arranged corresponding to the land electrodes 2a of the real patterns 2 in the dummy patterns 4. In this embodiment, as shown in FIG. 22, bump electrodes 60 are formed over the dummy land electrodes 4a. In the bump electrode forming step (S350), it is desired that almost the same number of bump electrodes 60 as the test chips which require the WPP technology should be formed over the dummy patterns 4 so as to improve work stability (solder wettability).

By forming the dummy patterns 4 in the chip region which does not require the WPP technology, the difference in the density of the redistribution interconnects 57 formed by the plating process can be reduced and the occurrence of appearance abnormalities in the real patterns 2 in the chip region which requires the WPP technology can be prevented.

While the invention made by the inventors has been described in its preferred embodiments, it is needless to say that the invention is not limited by the above embodiments and that various changes and modifications may be made in the invention without departing from the spirit and scope thereof.

For example, while the invention is applied to a semiconductor device having redistribution interconnects in the WPP technology in the above embodiments, the invention can be applied to a semiconductor device comprising plating interconnects as interconnects for semiconductor elements.

The present invention is effective for a semiconductor device, especially a semiconductor device having redistribution interconnects in the WPP technology, and is widely used in the manufacturing industry of semiconductor devices having a CSP (Chip Size Package) structure in particular.

What is claimed is:

1. A semiconductor device comprising:
   a plurality of multi-layer interconnects formed over a semiconductor substrate;
   a passivation film formed over the semiconductor substrate to cover the multi-layer interconnects;
   a plurality of redistribution interconnects formed over the passivation film; and
   a first insulating film formed over the passivation film so as to cover the redistribution interconnects,
   wherein the plurality of redistribution interconnects have first patterns and second patterns which are electrically separated from each other within the plane of the semiconductor substrate,
   wherein each of the first patterns is electrically coupled to a corresponding multi-layer interconnect in a first opening portion formed in the passivation film over a part of the uppermost-level interconnect of the corresponding multi-layer interconnect,
   wherein the second patterns are electrically separated from the multi-layer interconnects,
   wherein a part of each of the first patterns is exposed in a second opening portion formed in the first insulating film over the part of the first pattern, and
   wherein the first patterns and the second patterns are coexistent within the plane of the semiconductor substrate.

2. The semiconductor device according to claim 1, wherein each of a plurality of the second patterns has a part that is exposed in a third opening portion formed in the first insulating film over the part of the second pattern.

3. The semiconductor device according to claim 2, wherein a bump electrode electrically coupled to the part of the second pattern is formed over the part of the second pattern.

4. The semiconductor device according to claim 1, wherein a bump electrode electrically coupled to the part of first pattern is formed over the part of the first pattern.

5. The semiconductor device according to claim 1, wherein the semiconductor substrate configures a semiconductor chip having a first region and a second region around the first region within the plane,
   wherein the first patterns are formed in the second region, and
   wherein the second patterns are formed in the first region and the second region.

6. The semiconductor device according to claim 1, wherein a respective planar shape of each of the second patterns is circular or polygonal with all the corners having a blunt angle.

7. The semiconductor device according to claim 1, wherein the processing size of the second patterns is smaller than the processing size of the first patterns.

8. The semiconductor device according to claim 1, wherein the occupation ratio of the redistribution interconnects within the plane of the semiconductor substrate is 35% or more.

9. The semiconductor device according to claim 1, wherein the occupation ratio of the redistribution interconnects within the plane of the semiconductor substrate is 60% or less.

* * * * *